United States Patent [19]
Nugent

[11] Patent Number: 5,278,902
[45] Date of Patent: Jan. 11, 1994

[54] METHOD AND APPARATUS FOR TRANSITION DIRECTION CODING

[75] Inventor: Steven F. Nugent, Portland, Oreg.

[73] Assignee: Intel Corporation, Santa Clara, Calif.

[21] Appl. No.: 998,527

[22] Filed: Dec. 30, 1992

[51] Int. Cl.[5] .......................... H04L 9/02; G06K 5/04; G11B 5/00
[52] U.S. Cl. .......................................... 380/42; 371/1; 375/118; 395/550
[58] Field of Search ........................... 395/550; 371/1; 375/118; 380/42

[56] References Cited

U.S. PATENT DOCUMENTS

| | | | |
|---|---|---|---|
| 3,986,126 | 10/1976 | Gindi et al. | 307/208 |
| 4,430,735 | 2/1984 | Catiller | 371/25 |
| 4,682,342 | 7/1987 | Uetani | 375/38 |
| 4,777,616 | 10/1988 | Moore et al. | 371/15 |
| 5,036,230 | 7/1991 | Bazes | 307/527 |
| 5,185,736 | 2/1993 | Tyrrell et al. | 370/55 |

Primary Examiner—Stephen C. Buczinski
Attorney, Agent, or Firm—Blakely, Sokoloff, Taylor & Zafman

[57] ABSTRACT

The present invention provides a method and apparatus for encoding data in the context of a digital system for communicating binary information, including code words, over a communications channel. The information communicated over the channel is synchronized by a system clock producing a plurality of system clock pulses having edges associated with the binary information, where a change in the bit pattern between a bit and a prior adjacent bit represents a transition having a direction. The present invention encodes data words of n-bits each into a plurality of code words of m-bits each by selecting from the set of m-bit binary numbers those binary numbers in which each bit either experiences a transition in the same direction as the system clock edge associated with that bit or experiences no transition from a prior adjacent bit to that bit. Each of the selected binary numbers is a code word. Each data word is preferably associated with a code word. Data words are preferably formed into a message, and each code word associated with each data word of the message is longitudinally serialized so that each code word is represented by a serial bit pattern. The associated code words of the message are then transmitted in parallel with each other in a plurality of groups or "stacks".

39 Claims, 15 Drawing Sheets

| i | 3 | 2 | 1 | SELECT |
|---|---|---|---|--------|
| CLOCK | 1 | 0 | 1 | |
| m-BIT | 0 | 0 | 0 | yes |
| WORDS x | 0 | 0 | 1 | yes |
| | 0 | 1 | 0 | no |
| | 0 | 1 | 1 | no |
| | 1 | 0 | 0 | yes |
| | 1 | 0 | 1 | yes |
| | 1 | 1 | 0 | no |
| | 1 | 1 | 1 | yes |

Figure 5B

| DATA | CODE (ODD) | CODE (EVEN) |
|------|------------|-------------|
| 00 | 000 | 111 |
| 01 | 001 | 110 |
| 10 | 100 | 011 |
| 11 | 101 | 010 |
| EXTRA | 111 | 000 |

Figure 5C

| Data | Even TDC Code | Odd TDC Code |
|---|---|---|
| 0000 | 000000 | 000000 |
| 0001 | 000001 | 100000 |
| 0010 | 000101 | 101000 |
| 0011 | 010101 | 101010 |
| 0100 | 010111 | 101010 |
| 0101 | 000100 | 111010 |
| 0110 | 010001 | 001000 |
| 0111 | 010100 | 100010 |
| 1000 | 110001 | 001010 |
| 1001 | 110101 | 100011 |
| 1010 | 110100 | 101011 |
| 1011 | 110111 | 001011 |
| 1100 | 110000 | 111011 |
| 1101 | 111101 | 000011 |
| 1110 | 111100 | 101111 |
| 1111 | 111111 | 001111 |
| PAD | 011111 | 111110 |
| End of Message | 111100 | 001111 |
| Clock Transition | 010101 | 101010 |

METHOD AND APPARATUS FOR TRANSITION DIRECTION CODING

BACKGROUND OF THE INVENTION

1. Field of the Invention

The present invention relates to the field of digital communications, and in particular to a method and apparatus for encoding and decoding data.

2. Art Background

Advances in computer technology have increased the capability of information processing systems to transmit data at high rates. However, as system clock frequencies increase, the physical limitations introduced by system components become more pronounced and play a greater role in limiting achievable bandwidth. For example, as channel rates exceed 100 MHz, a significant portion of the data transfer cycle time may be occupied by jitter due to skew introduced by physical limitations inherent in system components.

FIGS. 1A and 1B illustrate the timing constraints of a typical synchronous transfer of data between a first (source) logic unit 1 and a second (destination) logic unit 2. The state of logic unit 1 is held in a register flip flop 3 having a data input $D_1$, a clock input $CK_1$ and a data output $Q_1$. Similarly, the state of logic unit 2 is held in a register flip flop 4 having a data input $D_2$, a clock input $CK_2$ and a data output $Q_2$. Both registers are clocked on the rising edge of pulses provided by a clock 5. Data is transferred between the two registers over a communication channel 6.

FIG. 1B illustrates the timing relationship between clock pulses arriving from clock 5 and data transferred over communication channel 6. The system hardware introduces a number of parameters that must be considered in order to execute a successful transfer of data. Each register has an inherent propagation delay $t_{prop}$, which represents the time it takes for data introduced at the input of the register to appear at the output after the register has been clocked. Because of environmental factors and variations in silicon uniformity from register to register, the propagation delay ranges from a minimum value $t_{propMIN}$ to a maximum value $t_{propMAX}$. The registers also require a set-up time $t_{su}$, which represents the time that data must remain at the input of a register before it can be clocked. Once a register has been clocked, based on internal register delays, the data must remain at the register input for a hold time $t_h$ in order for the register to capture the data.

Taking into consideration these parameters, two equations must be satisfied in order for data to be transferred successfully from the input $D_1$ of first register 3 to the output $Q_2$ of second register 4:

$$t_{propMAX} + t_{su} < T \tag{1}$$

$$t_{propMIN} > t_h, \tag{2}$$

where T is the clock period.

The first equation indicates that the clock period T must be long enough to allow data to propagate through first register 3 and to sit at the input $D_2$ of second register 4 before being clocked. The second equation requires that after the registers are clocked, the data appearing at the input $D_2$ of the second register 4 will not change until after it has already sat at the input for at least time period $t_h$.

These equations ignore the fact that the clock may not reach the registers at the same time because of various factors introducing delay into the system. The drivers at the source register and the receivers at the destination register of the communication channel are less than ideal and the respective environments of the driver and the receiver are not identical. For example, delay may be introduced by different wire lengths, different temperatures, ground shifts between the driver and receiver, ground bounce, and different power supply voltages. These environmental factors create a skew time $t_{skew}$ representing a difference in the arrival times of the clock pulse to the source register and to the destination register. The skew affects the above equations as follows:

$$t_{propMAX} + t_{su} + t_{skew} < T \tag{1a}$$

$$t_{propMIN} > t_h + t_{skew}. \tag{2a}$$

As shown by equation 1a, the environmental factors causing skew require that the clock period T be lengthened. As a consequence, skew slows the system data transfer rate, decreasing bandwidth.

One conventional method of minimizing skew entails transmitting the clock signal along the same communication channel as the data bits from source register to destination register. This eliminates many of the effects caused by environmental factors. However, this technique does not eliminate all forms of skew. For each clock edge, some data bits may be experiencing a transition from low to high voltage levels while others change from high to low. In other words, some data bits are changing in the same direction as the clock pulses while others are changing in the opposite direction. It is nearly impossible to achieve identical propagation delays through system components for both high-to-low and low-to-high signal transitions. Thus, when the clock and the data are making transitions in opposite directions, the different propagation delays experienced by the two pulses will introduce a new source of skew, thereby limiting the achievable bandwidth.

FIG. 2 illustrates the different propagation delays experienced by data making transitions in opposite directions. When data is clocked on the rising edge, this differential propagation delay effects the constraining equations in the following manner:

$$t_{propHLMAX} + t_{su} + t_{skew} < T \tag{1b}$$

$$t_{propLHMIN} > t_h + t_{skew} \tag{2b}$$

where $t_{propLHMIN}$ represents the minimum propagation delay experienced by a rising edge, and $t_{propHLMAX}$ the maximum propagation delay for a falling edge. In this example, it is assumed that $t_{propHLMAX} > t_{propLHMIN}$, where $t_{propLHMIN}$ may be considered to be the minimum propagation delay $t_{propMIN}$ of an ideal system without the differential propagation delay caused by opposing clock/data transitions. Based on these equations, because $t_{propHLMAX} > t_{propMAX}$, the clock period T must be increased further in order to validate the data, resulting in a further decrease in the system bandwidth.

FIGS. 3A and 3B illustrate the timing constraints of a more sophisticated data transfer system that, in addition to transmitting the clock along with the data signals, uses both clock edges to validate the data captured at the destination. This system has the added advantage of signalling at a lower frequency to reach higher data rates than the system of FIG. 1A.

All data bits change coincident with the input Clock A signal. In this embodiment, on the rising edge of the clock the odd data bits are captured at the destination logic unit 2 by data register 10. On the falling edge of the clock, the even data bits are captured at the destination by data register 11. The delay at the destination before the clock inputs is sufficiently long to meet the set up and hold time requirements of both registers 10 and 11. This insures that the data is valid at the data inputs of those registers.

The waveform of FIG. 3B illustrates the timing relationship at the destination logic unit 2. For the data to be captured reliably at the destination, the bit cell time T must be large enough to allow for the uncertainty in the arrival time of the clock edge caused by the skew between the falling and rising edges of the data and clock. In most systems, it is not known whether the rising edge will occur before the falling edge or vice versa. Typically the only known parameter is the skew or uncertainty in arrival times between any two signals. The skew causes a "window of uncertainty" in the data bits and clock received at the destination 2. This window is labeled "invalid" in FIG. 3B. The window of uncertainty also causes the generation time of Clock B to also be uncertain, creating "interval X". To guarantee that the setup and hold times of registers 10 and 11 are met, the valid data time must be the sum of the setup time, the hold time and interval X. This tends to elongate the bit cell time T, thereby reducing the data transfer rate. The bit cell time T=setup time+hold time+interval X+invalid time, resulting in a limitation of the transfer frequency to $$F = \frac{1}{2}(\text{setup time} + \text{hold time} + \text{interval } X + \text{invalid time})$$

In some systems, interval X and the invalid time are approximately equal, so that F can be simplified to $$F = 1/[2(\text{setup time} + \text{hold time}) + 4(\text{interval } X)]$$

This equation indicates that as the devices become faster and the setup and hold times decrease, the skew between the rising and falling edges (interval X) will dominate the equation and ultimately result in substantial limitations of system performance.

SUMMARY OF THE INVENTION

It is therefore an object of the present invention to encode data to ensure that the encoded data experiences transitions only in the same direction as transitions experienced by the clock pulses, thereby increasing achievable bandwidth.

The present invention provides a method and apparatus for encoding data in the context of a digital system for communicating binary information, including code words, over a communications channel. The information communicated over the channel is sychronized by a system clock producing a plurality of system clock pulses having edges associated with the binary information, where a change in the bit pattern between a bit and a prior adjacent bit represents a transition having a direction. The present invention encodes data words of n-bits each into a plurality of code words of m-bits each by selecting from the set of m-bit binary numbers those binary numbers in which each bit either experiences a transition in the same direction as the system clock edge associated with that bit or experiences no transition from a prior adjacent bit to that bit. Each of the selected binary numbers is a code word. Each data word is preferably associated with a code word. Data words are preferably formed into a message, and each code word associated with each data word of the message is longitudinally serialized so that each code word is represented by a serial bit pattern. The associated code words of the message are then transmitted in parallel with each other in a plurality of groups or "stacks".

BRIEF DESCRIPTION OF THE DRAWINGS

The objects, features and advantages of the present invention will be apparent to one skilled in the art in light of the following detailed description in which:

FIGS. 5A, 5B and 5C illustrate the generation of the TDC code.

DETAILED DESCRIPTION OF THE INVENTION

The present invention provides a method and apparatus for encoding data so that the encoded data experiences transitions only in the same direction as the associated edges of the clock pulse train. This type of coding will be referred to as "transition direction coding" (TDC) or "Nugent coding". TDC coding eliminates the propagation delay differential and the resulting skew caused by opposing clock and data transitions.

For purposes of explanation, specific embodiments are set forth to provide a thorough understanding of the present invention. However, it will be apparent to one skilled in the art that the invention may be practiced without these details. In other instances, well known elements, devices, process steps and the like are not set forth in detail in order to avoid unnecessarily obscuring the present invention.

Figure 1A:
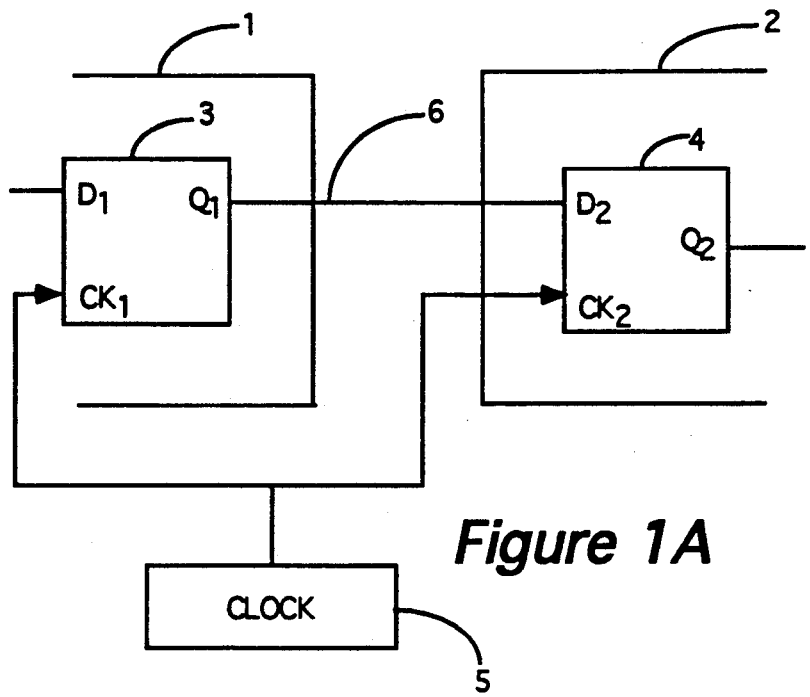
FIGS. 1A and 1B illustrate the transfer of data from a first logic unit to a second logic unit.
Figure 1B:
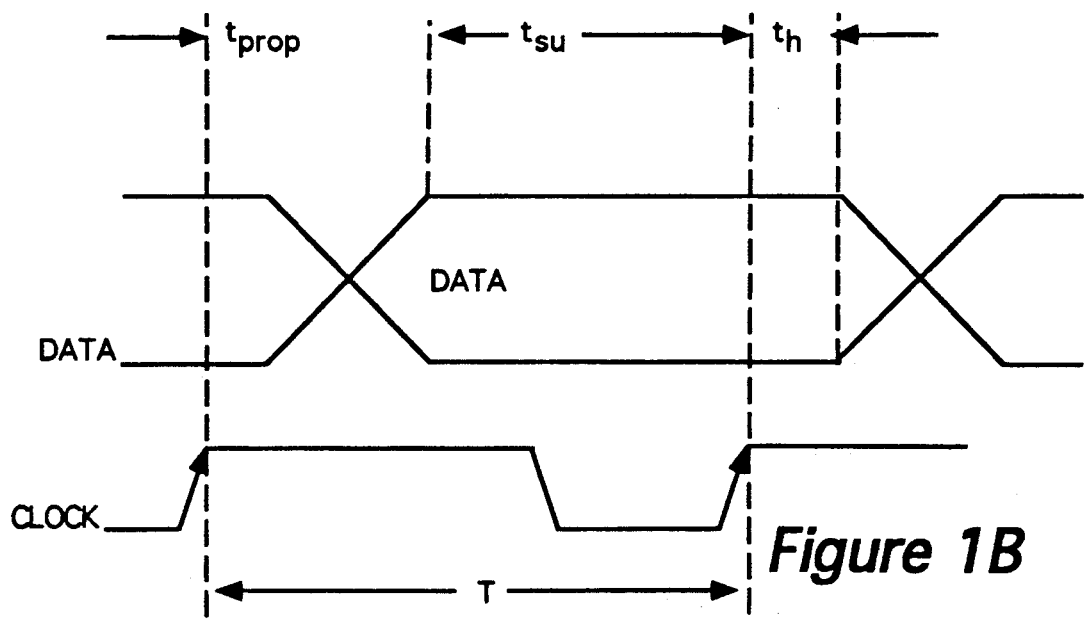
Figure 2:
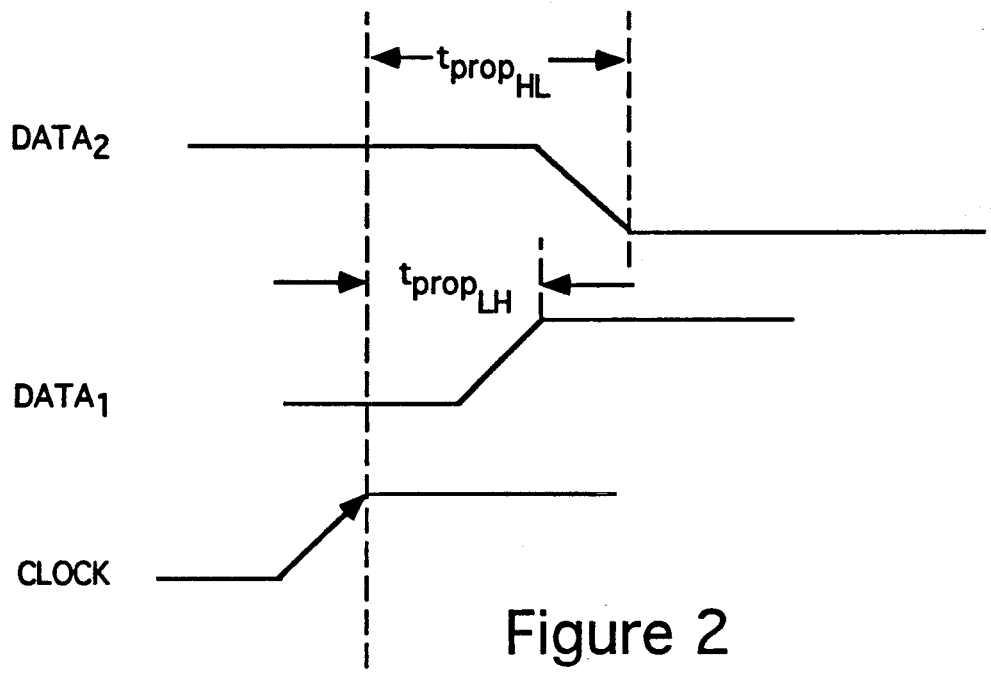
FIG. 2 is a timing diagram illustrating the differential propagation delay experienced by opposing clock/data transitions.
Figure 4A:
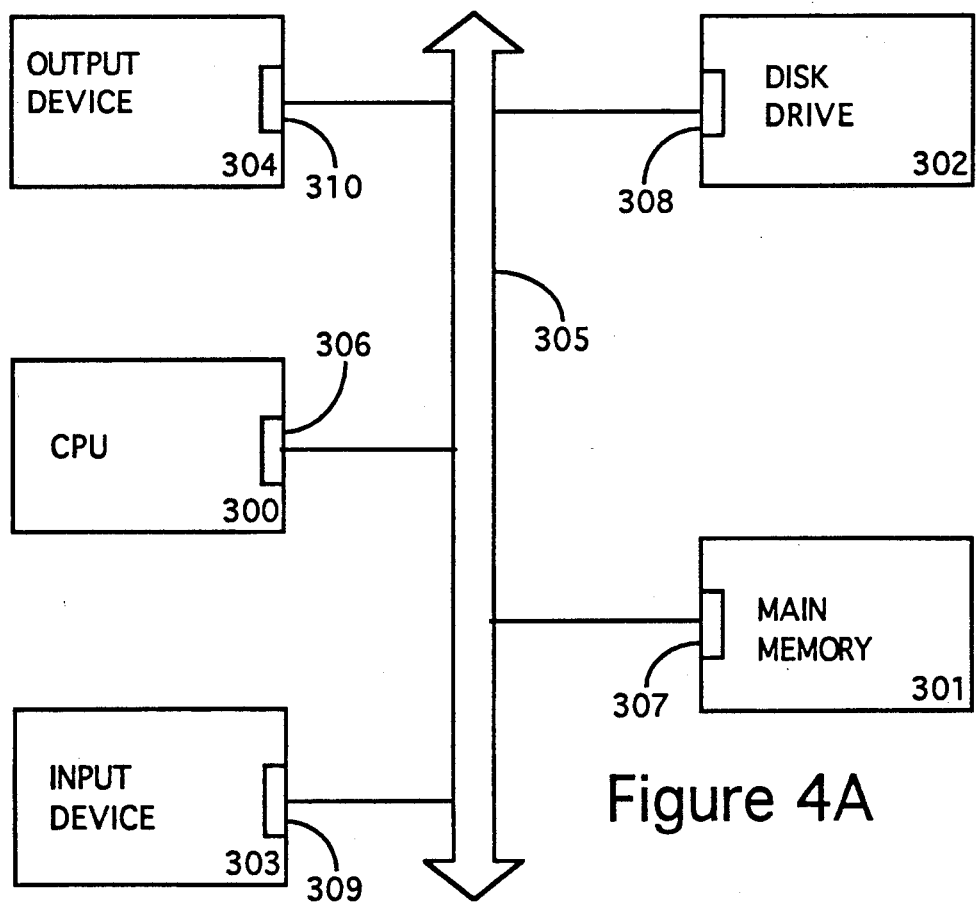
FIGS. 4A, 4B and 4C are block diagrams of uniprocessor and multiprocessor system implementing the present invention.

TDC coding may be advantageously used in any system involving the communication of digital information. For example, FIG. 4A is a block diagram of a standard computer system comprising a central processing unit (CPU) 300, a main memory 301, a secondary memory device 302, an input device 303, and an output device 304. The system components communicate over bus 305 through interfaces 306, 307, 308, 309 and 310.

The encoding/decoding may take place either in hardware or software. For example, CPU 300 may encode the data in software and then transfer the encoded data over bus 305 to main memory 301. Decoding in main memory 301 may be performed by hardware resident in interface 307. One can see that a wide variety of implementation modes are available in any computer system.

Figure 4B:
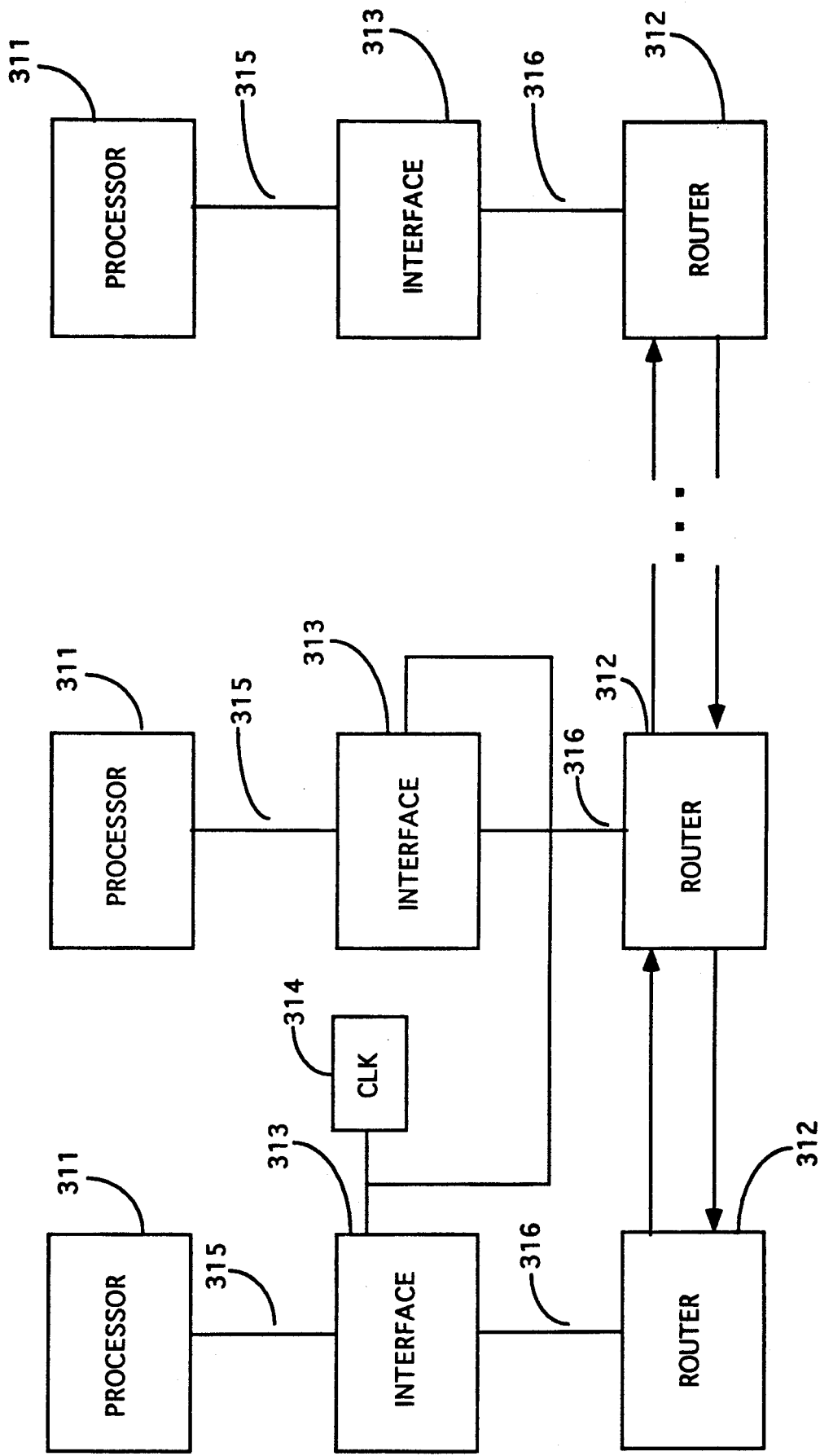

Similarly, TDC coding may be used in a multi-computer system. FIG. 4B illustrates a multi-processor system in which information is communicated between processors over a linear routing path. Each processor 311 communicates data to a message router 312 through an interface 313. The interfaces and message routers may be implemented using application specific integrated circuits (ASICs). The interface 313 reformats the data it receives to account for the difference in protocols, clock frequencies and other parameters inherent in other devices connected to the interface. A clock 314 synchronizes the interfaces 313, thus setting the data transfer rate. The memory bus 313 and the channels 316 include information, either in the message packets themselves or over control lines, that designates the message destination. The message router 312, as is well known in the art, uses this information to send the data to the message router associated with the designated destination processor, which in turn forwards the data to the associated processor.

Figure 4C:
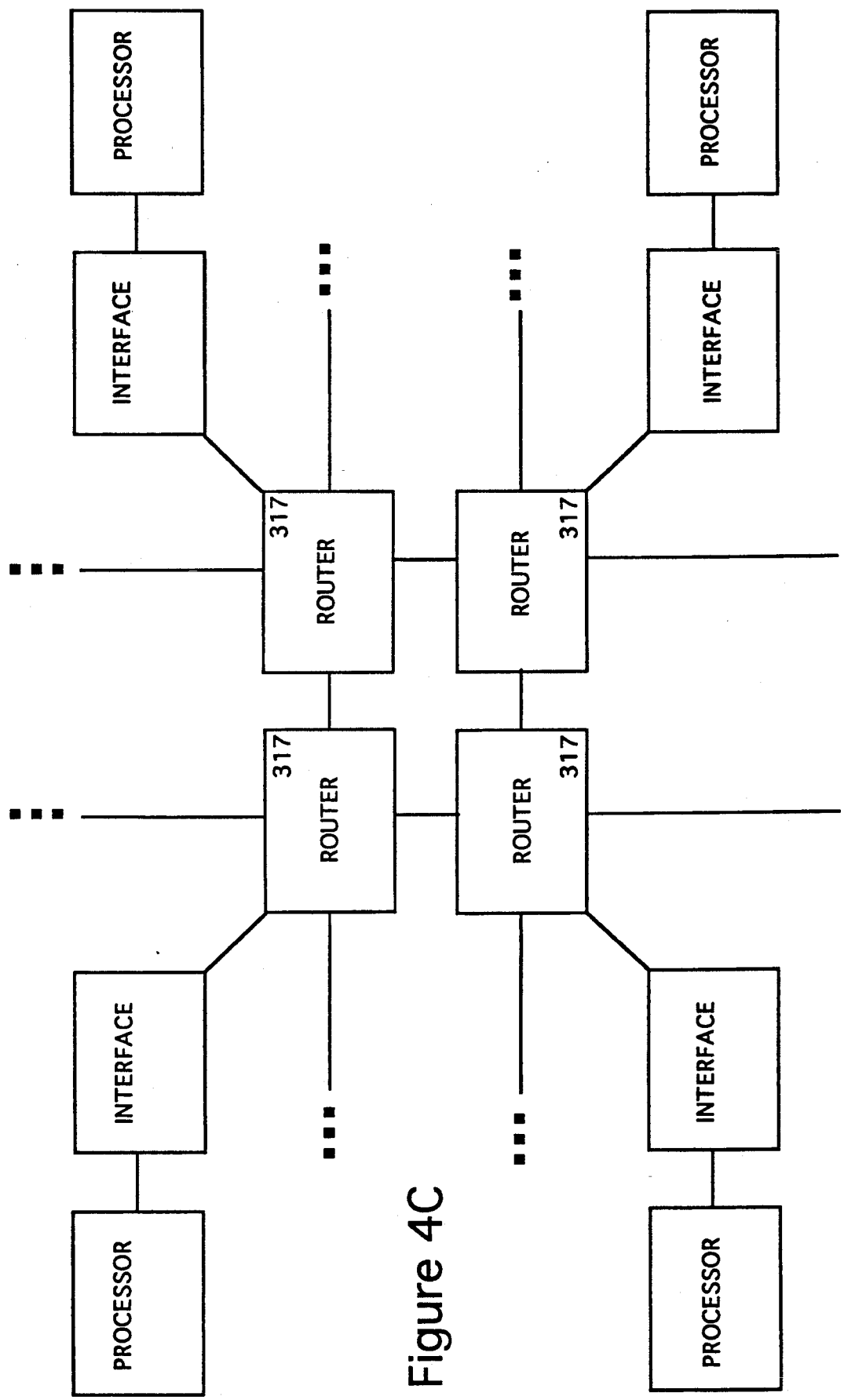

Another multi-processor topology is the two-dimensional or mesh routing configuration shown in FIG. 4C. Here, each router 317 is coupled to more than one other router. This arrangement provides for more than one path between any two processors, which permits interprocessor data transfers over alternative channels when more than one router might otherwise contend for the same bus.

The TDC coding of the present invention is used in the uniprocessor and multiprocessor systems described above, or in any digital system for that matter, to encode the data transferred between logic units in order to reduce the skew created by opposing clock and data transitions, thereby increasing system bandwidth. Again, as before, the encoding and decoding of data may take place either in software running in one of the processors or in hardware resident in one of the interfaces.

TDC coding is premised on the general rule that data is encoded to experience transitions only in the same direction as the transitions experienced by the clock pulses associated with the encoded data. It is assumed that the encoded data is clocked on both edges of the clock pulses. If the data were clocked on only one edge of a clock pulse then the data stream could never make more than one transition because of the TDC encoding rule.

The present invention encodes data by first selecting from a set of bit patterns those bit patterns in which each bit within the bit pattern either experiences a transition in the same direction as the clock edge associated with that bit or experiences no transition from a prior adjacent bit to that bit. The selected patterns are the TDC code words. Each one of the data words is then arbitrarily associated with a code word.

The length of the code words must be selected to ensure that every data word can be assigned a unique code word. It is assumed that $2^n$ n-bit data words are to be encoded into code words selected from the set of $2^m$ m-bit binary numbers. In the simplest embodiment, the number of bits m required to encode binary words of length n may be determined by the equation:

$$m = \hat{}\,[(1.5 \times n) - 0.5], \qquad (3)$$

where the symbol " $\hat{}$ " indicates rounding up to the next integer.

In an alternative embodiment, the TDC code may be formed by selecting only those bit patterns that not only follow the TDC coding rule but that also have either an odd or even number of binary ones. By introducing this additional constraint, the resulting set of code words may also serve as a longitudinal parity check code. If this embodiment is employed, then the length of the code words must be increased to ensure a one-to-one mapping of data words to code words.

Figure 5A:
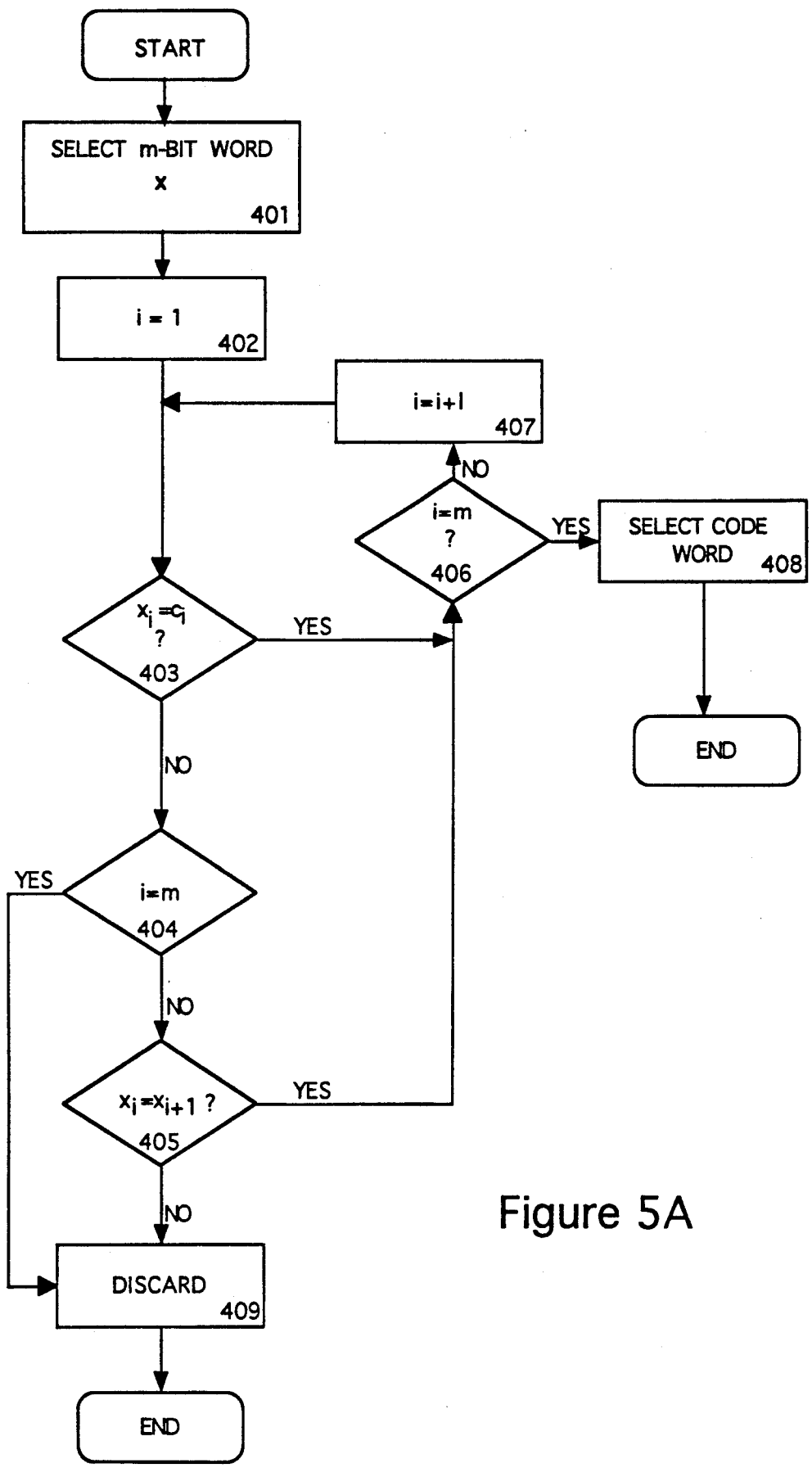

FIGS. 5A-C illustrate the generation of the TDC code. In FIGS. 5B-C, it is assumed that the data words are of length $n=2$ and that the code words are aligned with a clock pulse train beginning with a low-to-high transition (a rising edge). A low-to-high transition is represented by a "1" while a high-to-low transition (a falling edge) is represented by a "0". Using equation 3, the length m required to encode the two-bit data words is calculated as follows:

$$m = \hat{}\,[(1.5 \times 2) - 0.5] = 3$$

Each of the $2^3 = 8$ three-bit binary numbers may be represented as a vector $x = x_3 x_2 x_1$. The process of determining whether a particular m-bit number is a valid code word satisfying the TDC coding rule is illustrated in FIG. 5A. First, a particular m-bit number x is selected (step 401). Then the coding algorithm tests each bit of x to determine whether it satisfies the coding rule (steps 402, 403, 404, 405, 406, 407). The i-th bit $x_i$ of the potential code word is first compared to the associated clock pulse edge $c_i$ of the clock pulse train (step 403). (Each code word is "associated" with a clock pulse train in the sense that each code word is clocked by a portion of the clock pulse train that begins with either a low-to-high or high-to-low transition.) If both the i-th bit and the i-th clock pulse edge are experiencing a transition in the same direction ($x_i = c_i$), then that bit satisfies the TDC coding rule, and the algorithm moves on to test the next bit (steps 406, 407). If not, then the algorithm determines whether the i-th bit equals the i+1-th bit (step 405), meaning that no transition occurs from the prior adjacent bit $x_{i+1}$ to the i-th bit $x_i$. (If i=m then this test is bypassed (step 4). If this prong of the test is satisfied, then again the algorithm moves on to the next bit (steps 406, 407).

If each bit of the m-bit word x satisfies the tests of steps 3 and 5, then that word is selected as a code word (step 408). On the other hand, if x passes neither of the tests of steps 403 or 405, then the algorithm discards x because it has not satisfied the coding rule.

FIGS. 5B-C illustrate the selection of 3-bit code words to encode 2-bit data words. All of the selected words satisfy the TDC coding rule diagrammed in FIG. 5A. For example, assuming the clock begins with a low-to-high transition, i.e., a "1", the number 100 is a valid code word. With respect to the first bit, the number 100 experiences no transition from the prior adjacent bit (the second bit), a "0", to the first bit, another "0". The second bit experiences a transition in the same direction as the second clock pulse edge, and similarly the third bit experiences a transition in the same direction as the third clock pulse edge.

As shown in FIG. 5C, after selecting the 3-bit binary numbers that follow the TDC coding rule, each 2-bit data word is assigned a TDC code word. (Refer to only the odd code words in the second column for now.) Typically, after this assignment is completed, some code words remain unassigned to any data words. These extra code words may be used as pad characters, or as various control characters such as the "end of message" symbol.

Figures 6A, 6B:
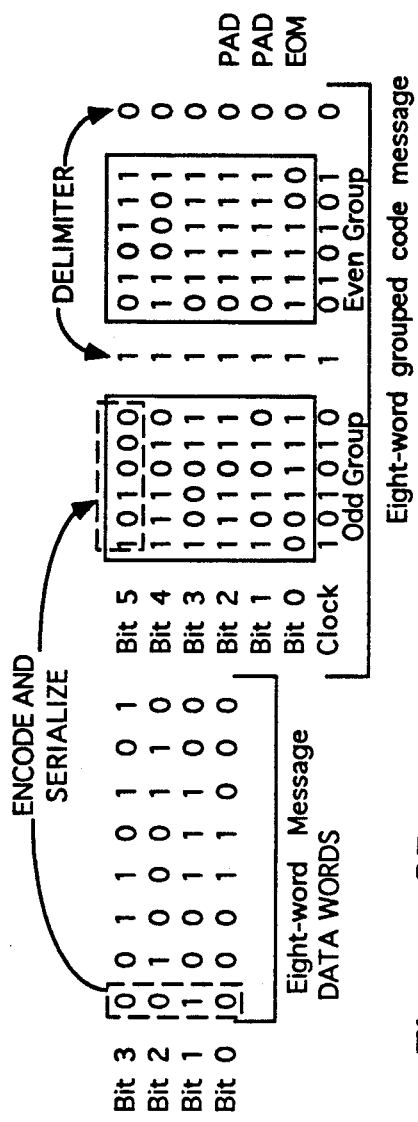
FIG. 6A illustrates the coding of data into odd and even groups.
FIGS. 6B and 6C diagram the grouping of TDC code words.

In a preferred embodiment, the data is encoded into both an even TDC code and an odd TDC code, as illustrated in FIG. 6A for the coding of 4-bit data words. The even TDC code words are associated with a clock pulse train that begins with a falling edge or a "0". Conversely, the odd TDC code words are associated with a clock pulse train that begins with a rising edge or a "1". Both the even and the odd code words satisfy the TDC coding rule. After either the even or odd code set has been generated, the code set of opposite parity may be generated by either complementing or, for m even, reversing the order of the bits of the first generated code set. See also FIG. 5C.

Figure 6C:
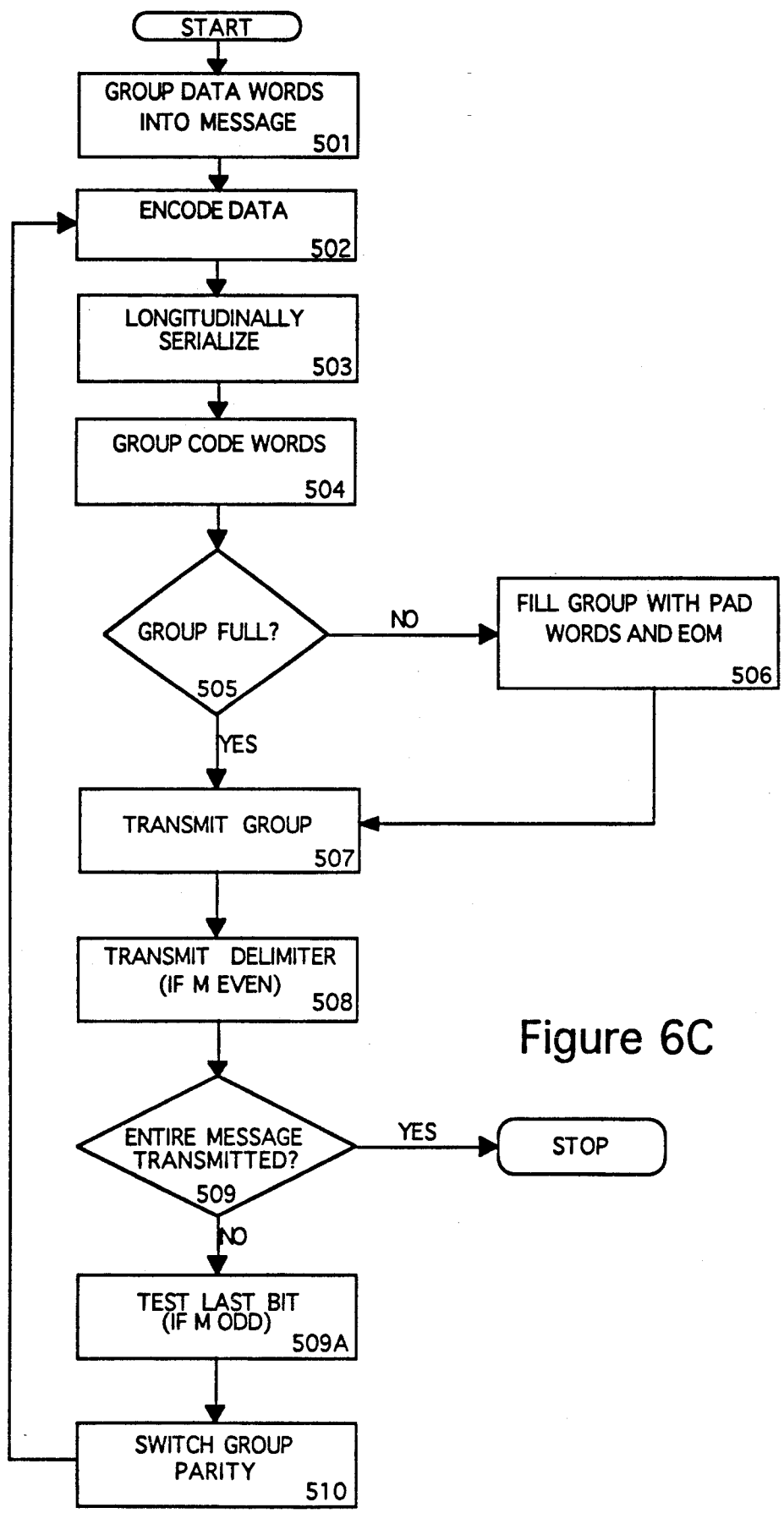

In a further preferred embodiment the present invention transfers data by first grouping the n-bit data words into a multiple word message (step 501) as illustrated in FIG. 6B and diagrammed in FIG. 6C. The n-bits of each data word emerge from the source in parallel with each other. After encoding (step 502), the resulting code words are longitudinally serialized (step 503), meaning that each parallel code word is converted to a serial representation. The serial encoded data words are "stacked" into groups so that the code words may be output in series as a group or "stack".

The groups may be separated by delimiter words sent in parallel to ensure that the bits traveling along the data communications channel adhere to the TDC coding rule during the transition between groups. Thus, the bits of the delimiter words must not make a transition in a direction opposite the clock pulse edges that occur between transmission of the groups. As a result, for m even, the delimiters alternate from all ones to all zeros from group to group. For m odd, even length delimiter words may be used or, as described below, no delimiter is necessary.

For m even, the size of the delimiter word is reduced to one bit by sending alternating groups of odd and even code words, as shown in FIG. 6B. (Odd and even code words are not to be confused with odd length and even length code words. Odd and even code words are selected from the odd and even sets of code words, respectively.) A group is first formed of odd or even code words, depending upon whether the group is to be clocked by a clock pulse train beginning with a "1" or a "0" edge (step 504). If the code words do not fill up the group, then that group is the last group in the message and is thus filled with pad words, if necessary, and can be terminated with an "end of message" (EOM) symbol (steps 505, 506). The group is then transmitted followed by the delimiter word (steps 507, 508). If the entire message has not been transmitted, then a code word group is formed of code words having a parity opposite to that of the previously transmitted group (steps 509, 510, 502, 503, 504), i.e., if an odd (even) group has been sent, then the next group is formed of even (odd) group code words. The group just formed is then padded and terminated with the EOM symbol, if necessary, and transmitted, and the process continues until the entire message has been communicated.

For code words of odd length (m odd), the parity of the groups is also alternated, but there is no need to use delimiter words to separate the groups or "stacks". Unlike the case for m even, the odd length code words used in consecutive can be selected to ensure adherence to the TDC coding rule during the transition between groups. This is accomplished by creating two sets of odd length code words for the odd group and two sets of odd length code words for the even group: a first set of those odd (even) code words that ensure that the coding rule is followed between groups when the last bit of the previous even (odd) serial code word is a one, and a second set of those odd (even) code words that ensure that the coding rule is followed between groups when the last bit of the previous even (odd) serial code word is a zero. Thus, after a group has been transmitted, the last bit of each serialized code word in the group is tested (step 509A). If the last bit of a particular code word is a one bit, then the subsequent code word that occupies the same position in the "stack" of the next group is chosen from the first set. On the other hand, if the last bit of a code word is a zero bit, then the subsequent code word in the same stack position is selected from the second set (step 502).

Odd length encoding to eliminate the need for a delimiter word may be generalized as follows. When encoding an odd group, if the last bit of the previous even code word occupying the same position in the stack is a one, then the first set of odd code words comprises those odd code words in which the first bit of the succeeding odd code word must be a one. If the last bit of the previous even code word is a zero, then the second set of odd code words comprises those odd code words in which the first bit of the succeeding odd code word may be a one or a zero in order to satisfy the coding rule. When encoding an even group, if the last bit of the previous odd code word is a one, then the first set of even code words comprises those even code words in which the first bit of the succeeding even code word may be a one or a zero. If the last bit of the previous odd code word is a zero, then the second set of even code words comprises those even code words in which the first bit of the succeeding even code word must be a zero.

For example, referring back to FIG. 5C, assume that n=1, while maintaining the code word length m as 3. Thus, the data words 0 and 1 can be assigned to code words from the sets of five odd code words or five even code words. Also assume that an odd group is transmitted with the code word for the binary number 0 at the top of the group stack, followed by an even group with the code word for the number 1 at the top of the stack. The number 0 can be arbitrarily encoded as 100 for the odd group. However, the even code word representing 1 is constrained to those code words that ensure that the coding rule is followed during the transition between groups. Since the last bit of 100 is a 0, and the clock is making a transition from a 1 to a 0 (the odd group clock 101 followed by the even group clock 010), the code word for 1 in the subsequent even group must start with a 0, such as 000 or 010. In this manner, code words are assigned "on the fly" to ensure adherence to the coding rule for m odd without the need for delimiter words.

In the example above, the data word length was set to n=1 because the code word length m must satisfy the conditions that m is odd and that each data word can be uniquely assigned an odd code word from the first set of odd code words, an odd code word from the second set of odd code words, an even code word from the first set of even code words, and an even code word from the second set of even code words. Code words of length $m=3$ meet these criteria for $n=1$, but not for data words of length $n=2$, which require odd length code words of length $m=5$.

Figure 6D:
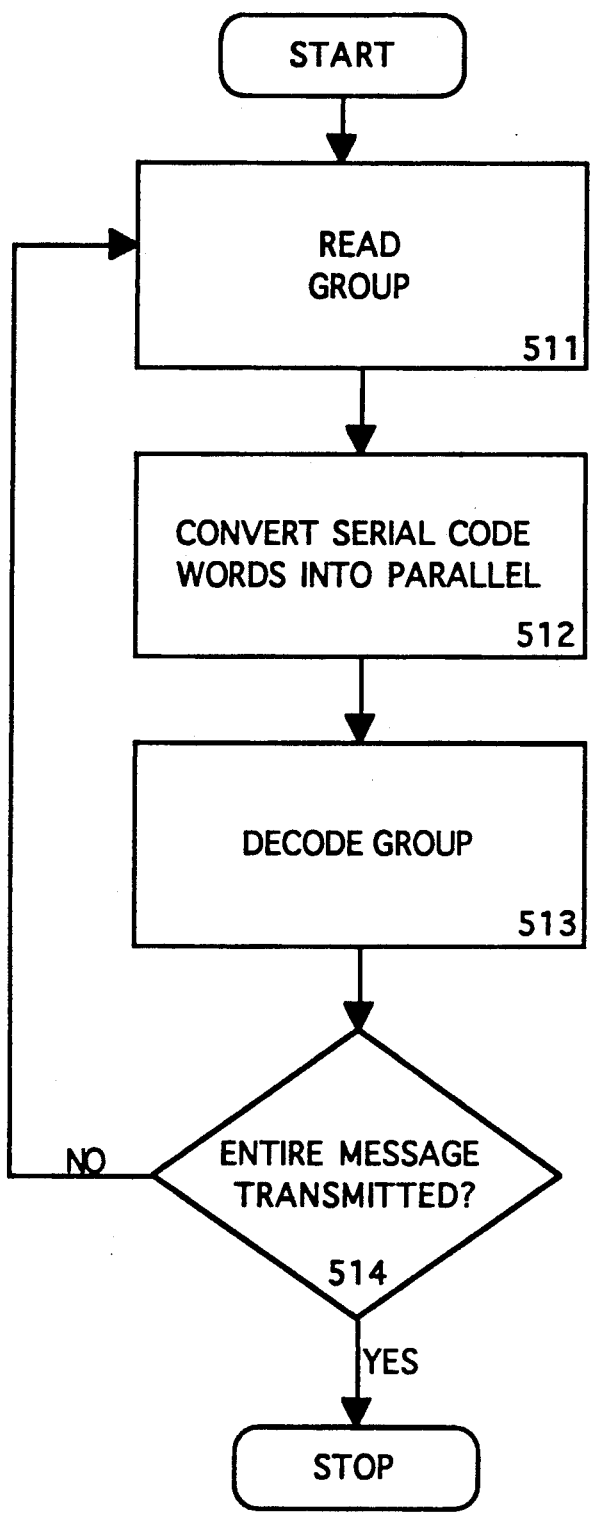
FIG. 6D is a flow diagram of the decoding of TDC code groups.

Upon receiving the encoded groups, the present invention reads each group, and converts the serial code words into parallel format for decoding (steps 511, 512, 513), as shown in FIG. 6D.

By grouping code words, the effect of coding on bandwidth can be minimized. In the example above, 4-bit data words are coded into 6-bit code words. Without coding, the 4-bit data word could have been serially transmitted in four clock cycles. However, after coding, six clock cycles are required to serially transmit the same quantity of information in ungrouped code word form. Thus the data rate has slowed from 4 words per 4 clock cycles $=1$ word/cycle to 4 words per 6 clock cycles$=2/3$ word/cycle. However, according to the present invention as shown in FIG. 6B, m code words of m-bits each fill each group. As a result, in this example, six code words are transmitted in six clock cycles. Thus, by grouping the code words the data rate returns to one word/cycle, resulting in no loss of throughput.

Figure 7A:
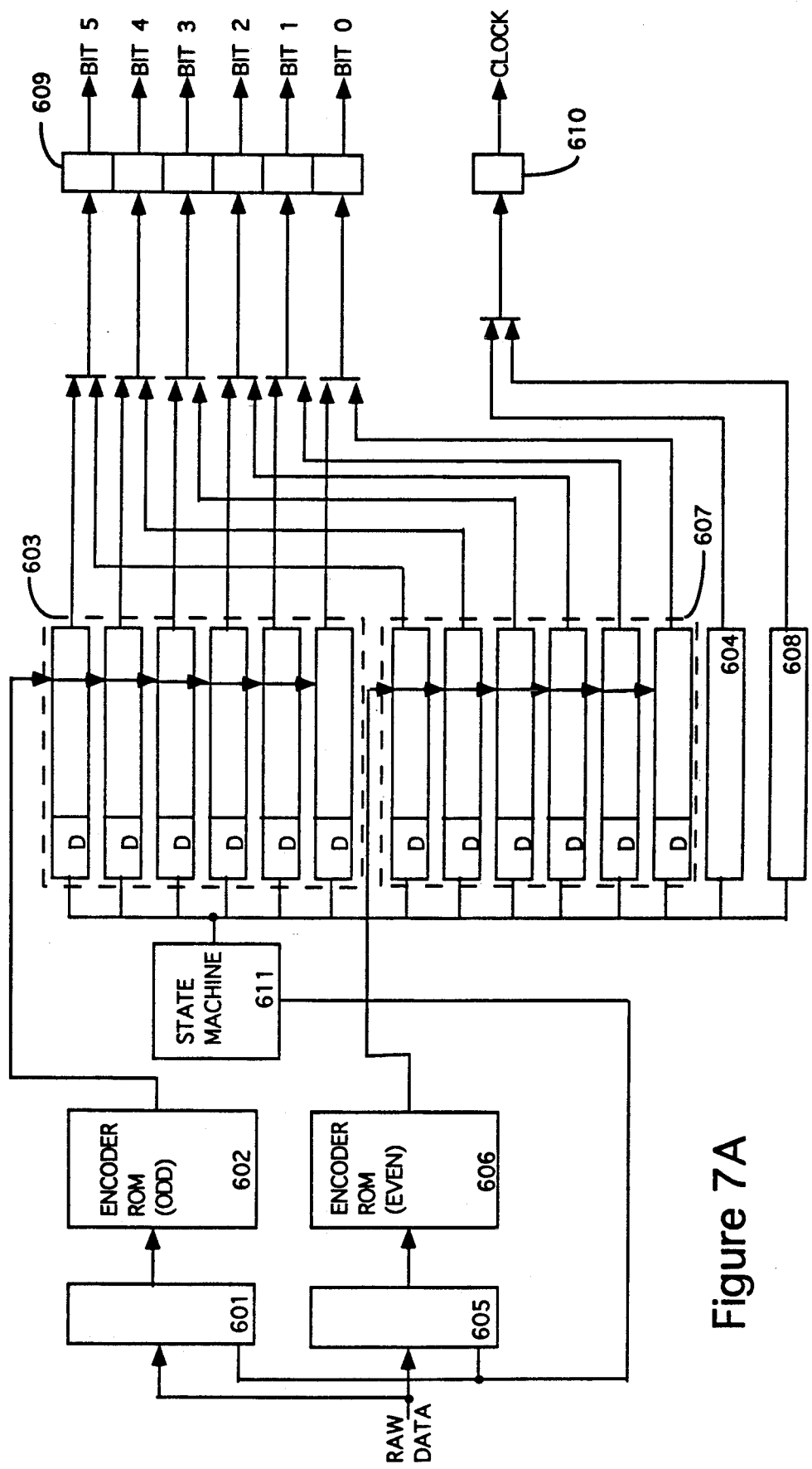
FIGS. 7A and 7B are hardware implementations of encoders of the present invention.
Figure 7B:
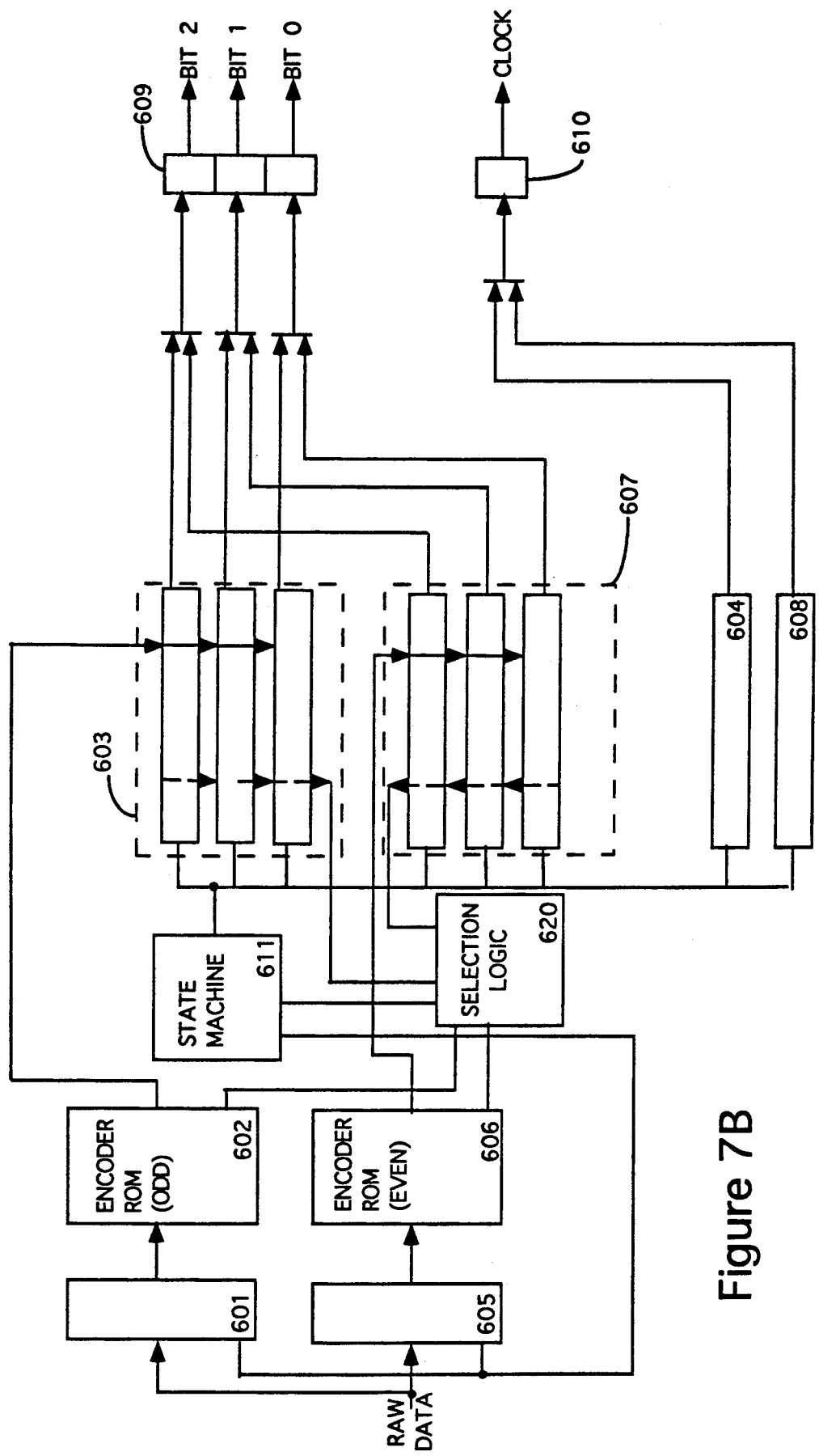

FIGS. 7A and 7B illustrate preferred hardware embodiments of the encoder of the present invention. Specifically, the hardware performs the functions of odd and even encoding, longitudinal serialization and grouping.

The system of FIG. 7A illustrates an encoder for even length code words, specifically the case where $n=4$ and $m=6$, although the invention of FIG. 7A is generally applicable to a wide variety of data and code word lengths. The system comprises an odd group input register 601, an odd group ROM encoder 602, an odd group of shift registers 603, and an odd group clock 604. For even group encoding, the system includes an even group input register 605, an even group ROM encoder 606, an even group of shift registers 607, and an even group clock 608. The resulting code words are held in an output code register 609 and the associated system clock pulses are held in a clock register 610. A state machine 611 performs overall control of the system hardware.

Assuming that the odd group is first encoded, state machine 611 first enables only the odd group components. Thus, when data is presented to input registers 601 and 605, the data is only stored in odd group input register 601. The data word is presented to ROM 602, which acts as a look-up table to encode the data into a code word. (The TDC code is preferably generated off-line by computer and loaded into the ROM.) The parallel code word is presented at the broadside load input of each of the shift registers in the odd group of shift registers 603. (Note that for this example, six shift registers are used to represent the $m=6$ code words in the group.) State machine 611 successively enables the broadside load function of each odd group shift register as each new code word in the odd group is presented to the shift registers on each input clock pulse edge. Consequently, each data word in the first group of six incoming data words is encoded and the corresponding code words are individually loaded each into a separate shift register.

When all six shift registers in the group are full, the state machine 611 instructs the odd group of shift registers 603 to begin serially shifting the code words out of the shift registers. Tagged on to the end of each 6-bit code word in each shift register is a delimiter word D, which is shifted out along with the code words. In addition, the alternating zeros and ones stored in odd group clock 604 are shifted out to clock register 610 to provide a synchronized system clock pulse train associated with the output code words.

As the odd group of code words is being shifted out, state machine 611 enables the even group of components. The data words presented at the input of even group input register 605 are encoded by ROM 606 and successively broadside loaded into the individual shift registers of the even group shift registers 607. After the odd group of code words has been shifted out, state machine 611 instructs the even group shift registers 607 to begin serially shifting the even group code words to output code register 609. Even group clock shift register 608 stores an alternating group of zeros and ones that are the complement of the bits stored in odd group clock shift register 604 to act as an even system clock pulse train. The even system clock is shifted to clock output register 610 at the same time as the even group code words. The "ping-ponging" back and forth between odd and even groups provides for an efficient coding method that increases encoding speed with a minimum of components.

FIG. 7B illustrates the preferred encoder for m odd; in this case $m=3$. Note that each shift register is of length $m=3$ due to the deletion of the delimiter bit, which is unnecessary for m odd.

The key addition to the decoder is a selection logic circuit 620. In this embodiment each encoder ROM holds two look-up tables: one table for the case where the previous code word that occupied the same position in the stack of the previous group ended in a one, and a second table for the case where the previous code word ended in a zero. The selection logic is coupled to each shift register to receive and test the last bit of each word in the group being transmitted. Depending on whether the bit is a zero or a one, the selection logic 620 uses the bit to select the appropriate look-up table within the particular encoder ROM that is enabled by state machine 611 to encode the next group properly. The remaining operations performed by the odd length encoder of FIG. 7B are analogous to those of FIG. 7A and need not be discussed in further detail.

Figure 8:
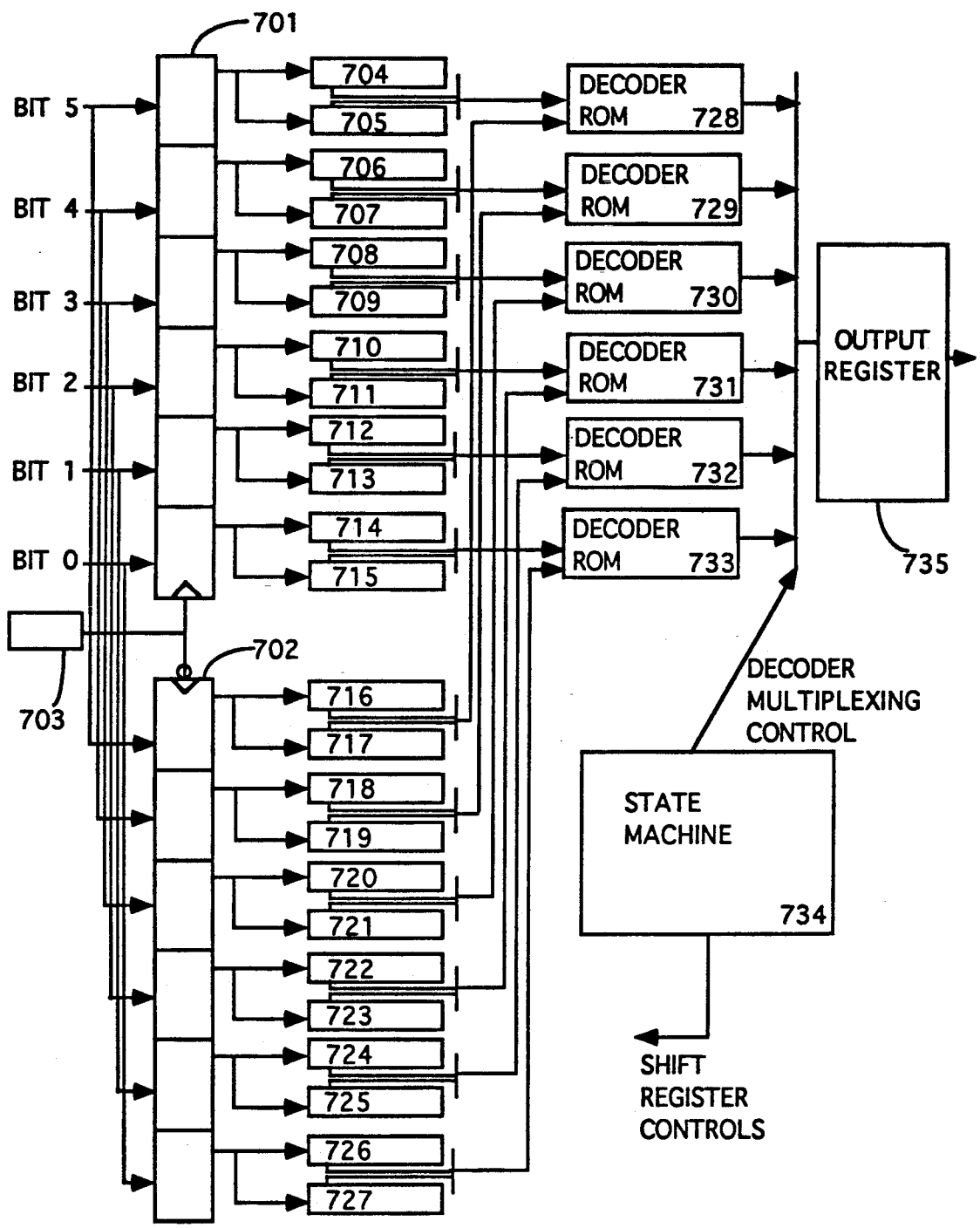
FIG. 8 is a hardware implementation of a decoder of the present invention.

FIG. 8 illustrates a preferred embodiment of the decoder of the present invention for the case of $n=4$, $m=6$. The decoder comprises a first group of input registers 701, a second group of input registers 702, a clock input 703, a set of 3-bit shift registers 704–727, and decoder ROMs 728–733. The system also includes a state machine 734 and an output register 735. Note that the length of the shift registers$=$ ~ $m/2$, and in this example $m/2=6/2=3$ bits.

The encoded group words are read into input registers 701 and 702 in an alternating manner on successive clock pulse edges. During the reading of the first incoming odd group, state machine 734 enables the serial loading of a first odd group of shift registers 704, 706, 708, 710, 712, 714 during the rising or "1" clock pulse edges. Conversely during the falling or "0" clock pulse edges, state machine 734 enables the serial loading of a second odd group of shift registers 716, 718, 720, 722, 724 and 726. An entire odd group has been loaded when the first and second odd groups of the three-bit shift registers are full. At that point, the state machine 734 instructs the shift registers to broadside unload their contents into the decoder ROMs 728-733. The bits of each 3-bit parallel word unloaded from each first odd group shift register are interleaved with the bits of the 3-bit parallel word unloaded from the corresponding 3-bit second odd group shift register to recover the 6-bit code words in parallel form. The interleaving may be hardwired or implemented by a simple routing circuit. Each of these code words is presented at the input of the corresponding decoder ROM to recover the 4-bit data word. The state machine 734 multiplexes the decoder ROMs so that the parallel data words are output in serial order one at a time to output register 735.

While the first (odd) group of data words are being unloaded from the shift registers, under control of state machine 734 the next (even) group of data words are loaded into a first even group of shift registers 705, 707, 709, 711, 713 and 715, and into a second even group of shift registers 717, 719, 721, 723, 725 and 727, in a fashion similar to that of the loading of the first and second odd groups of shift registers. After the first (odd) group of code words has been shifted out, state machine 734 then enables the broadside unloading of the first and second even groups of shift registers in an interleaved manner to the decoder ROMs. As before, state machine 734 multiplexes the decoder ROMs so that the recovered data words are output one at a time to output register 735.

For the case of m odd, the decoder operates in a similar fashion with one significant modification. Each decoder ROM not only decodes odd and even code words, but also includes decoding tables for the two sets of odd group codes and the two sets of even group codes. To ensure proper decoding, each decoder ROM may be internally wired to test the last bit of each serial code word in order to select the proper table for decoding the next serial code word occupying the same position in the stack.

Figure 3A:
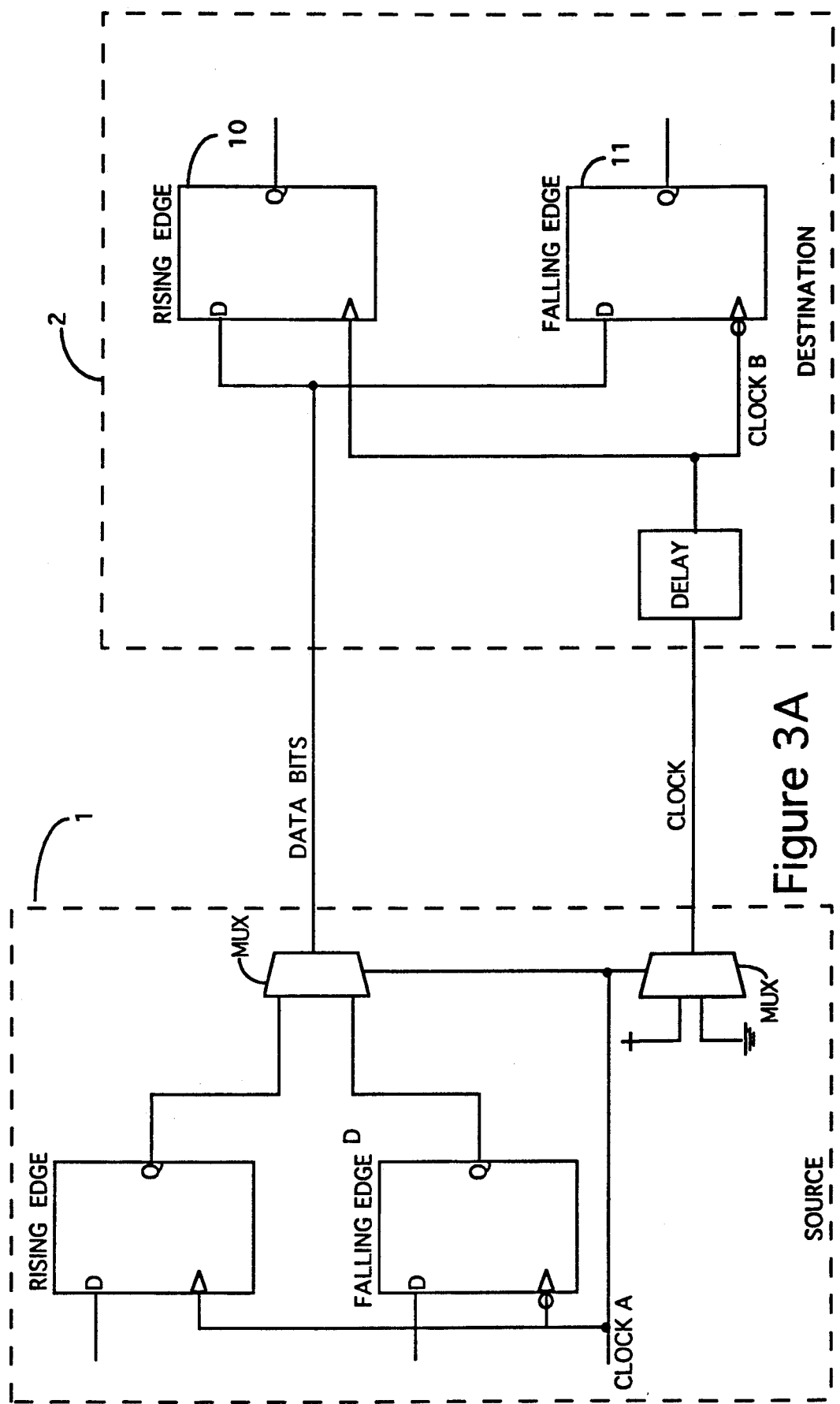
FIG. 3A illustrates a system for clocking data on both edges of the clock pulses.
Figure 3B:
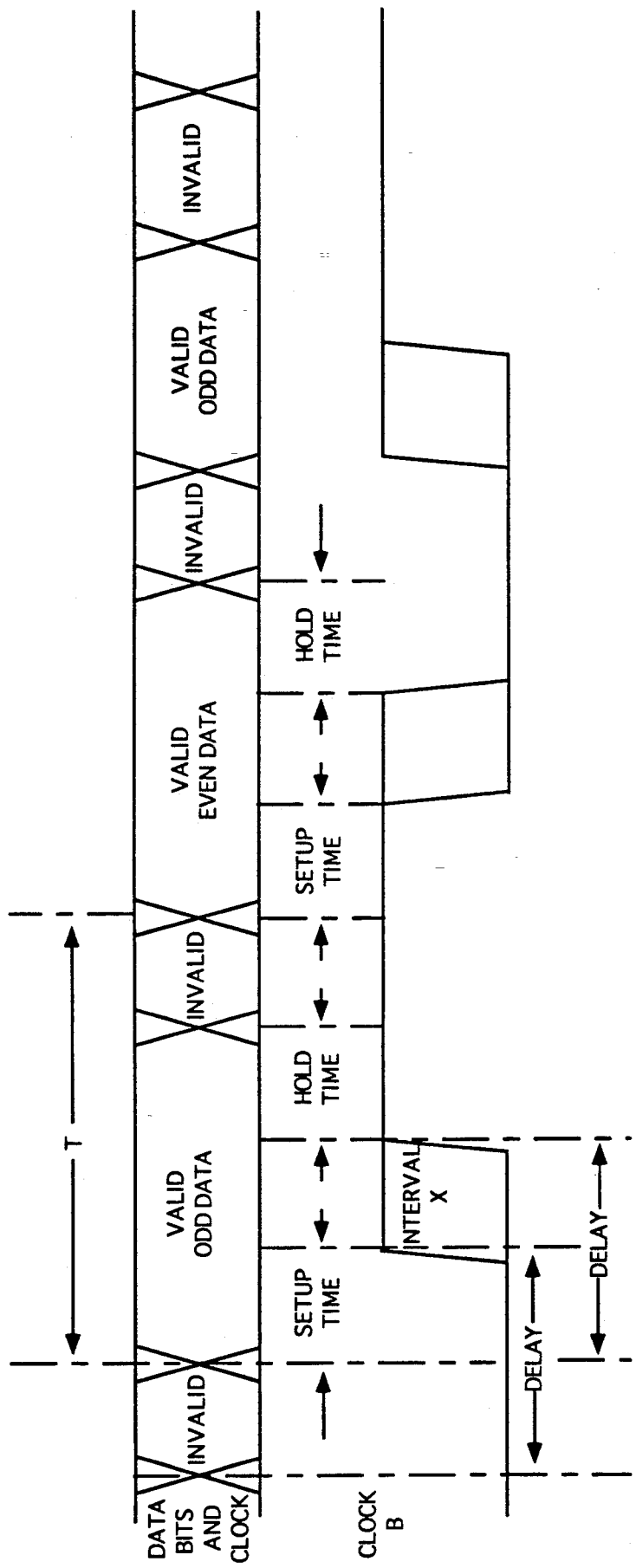
FIG. 3B is the timing diagram for said system.
Figure 9:
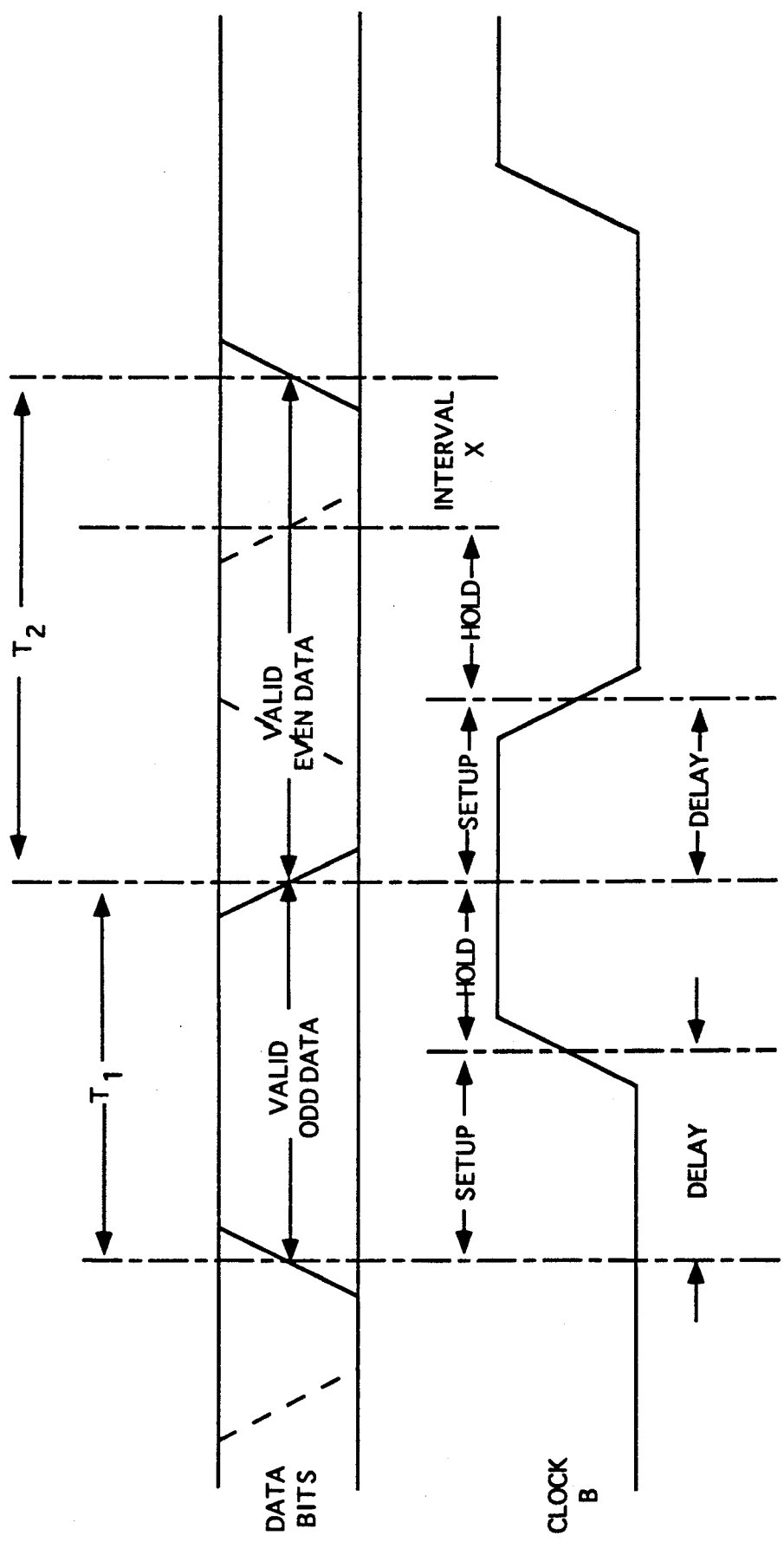
FIG. 9 is the timing diagram of the system of FIG. 3A using the coding of the present invention.

When the TDC coding protocol described in the various embodiments above is followed, the timing of FIG. 9 results. The dashed lines in FIG. 9 indicate where the opposite data transitions would occur, if they were permitted. Under the coding rule, there is no uncertainty in the arrival time of clock B because it only transitions in the same direction as the arriving data bits. The bit cells $T_1$ and $T_2$ are of different lengths due to the skew of the rising versus the falling edges. In bit cell $T_1$, the bit cell need only be long enough to satisfy the setup and hold time requirements of registers 10 and 11 of FIG. 3A. In bit cell $T_2$, the bit cell satisfies the setup and hold times of registers 10 and 11, but also adds additional hold time equal to interval X equal to the skew between rising and falling signal edges. The performance of the system using the new protocol is proportional to the average of the bit cell times $T_1$ and $T_2$: $(T_1+T_2)/2$. The transfer frequency of the system is now limited to $$F = 1/(T_1 + T_2)$$
$$= 1/[(\text{setup} + \text{hold}) + (\text{setup} + \text{hold} + \text{interval } X)]$$
$$= 1/[2(\text{setup} + \text{hold}) + \text{interval } X]$$

Recall that for the conventional data transfer system without TDC coding, the transfer rate is $$F = 1/[2(\text{setup} + \text{hold}) + 4(\text{interval } X)],$$

indicating that skew (interval X) dominates the equation. However, in the transfer rate equation for the TDC coding system, skew clearly has a very small effect on rate in relation to the setup and hold times. In fact, the effect of skew has been decreased by a factor of four, resulting in a substantial increase in system performance.

Although the invention has been described in conjunction with preferred embodiments, it will be appreciated that various modifications and alterations may be made by those skilled in the art without departing from the spirit and scope of the invention.

I claim:

1. In a digital system for communicating binary information over a communications channel synchronized by a system clock producing a plurality of system clock pulses having edges associated with the binary information, said binary information including a plurality of code words, wherein a change in the bit pattern between a bit and a prior adjacent bit represents a transition having a direction, an encryption device comprising:

an encoder means for providing a plurality of code words in response to a plurality of data words associated with said code words; and a parallel to serial converter means for providing a plurality of stacks over said channel, each said stack comprising a plurality of code words, each code word being transmitted in serial form at the same time as each other code word in the stack, each said code word comprising an m-bit binary number in which each bit either experiences a transition in the same direction as the system clock edge associated with that bit or experiences no transition from a prior adjacent bit.

2. The encryption device of claim 1,
   said encoder means comprising:
   a first encoder look-up table means for providing an odd code word in response to an n-bit data word received during one of a plurality of input clock edges during one of a plurality of first states, and
   a second encoder look-up table means for providing an even code word in response to an n-bit data word received during one of said input clock edges during one of a plurality of second states, said first and second states alternating in time,
      each said odd code word comprising a code word in which the first of said system clock edges associated with said code word is in a first direction,
      each said even code word comprising a code word in which the first of said system clock edges associated with said code word is in a second direction; and
   said parallel to serial converter means comprising:
   a plurality of first shift register means for receiving a plurality of said odd code words in parallel form from said first encoder look-up table means during the first state and unloading said odd code words in serial form to produce one of a plurality of odd stacks; and
   a plurality of second shift register means for receiving a plurality of said even code words in parallel form from said second encoder look-up table means during the second state and unloading said even code words in serial form to produce one of a plurality of even stacks; and
   said encryption device further comprising:

encoder state control means, coupled to said first and second encoder look-up table means and said pluralities of first and second shift register means, for controlling said first and second encoder look-up table means and said pluralities of first and second shift register means in said first and second states.

3. The encryption device of claim 2, wherein each said first shift register means successively broadside loads an odd code word during successive input clock edges in the first state and, after each said first shift register means has been loaded, said plurality of first shift register means serially unloads said odd code words to provide said odd stack during the subsequent second state; and each said second shift register means successively broadside loads an even code word during successive input clock edges in the second state and, after each said second shift register means has been loaded, said plurality of second shift register means serially unloads said even code words to provide said even stack during the subsequent first state.

4. The encryption device of claim 3, wherein for m even, said first shift register means includes a first delimiter register means for storing a "1" bit after each said odd code word, and said second shift register means includes a second delimiter register means for storing a "0" bit after each said even code word.

5. The encryption device of claim 3, further comprising a system clock shift register means for, during the second state, providing an m-bit word of alternating ones and zeros beginning with a one bit, and, during the first state, providing an m-bit word of alternating ones and zeros beginning with a zero bit.

6. The encryption device of claim 2, said first encoder look up table means further comprising means for providing an odd code word from either a first or a second odd table in response to a first or a second odd selection signal, respectively, said odd code word associated with corresponding positions in the odd and even stacks;

said first odd table being comprised of odd code words in which the first bit is a one, said second odd table being comprised of odd code words in which the first bit either is a one or a zero;

said second encoder look up table means further comprising means for providing an even code word from either a first or a second even table in response to a first or a second even selection signal, respectively, said even code word associated with corresponding positions in the odd and even stacks;

said first even table being comprised of even code words in which the first bit either is a one or a zero, said second even table being comprised of even code words in which the first bit is a zero;

said encryption device further comprising selection logic means for:

testing the last bit of a previous even code word stored in each said second shift register means, and providing said first odd selection signal if the last bit of the previous even code word occupying the corresponding position in the stack as the odd code word is a one, and providing said second odd selection signal if the last bit of the previous even code word occupying the corresponding position in the stack as the odd code word is a zero, testing the last bit of a previous odd code word stored in each said first shift register means, and providing said first even selection signal if the last bit of the previous odd code word occupying the corresponding position in the stack as the even code word is a one, and providing said second even selection signal if the last bit of the previous odd code word occupying the corresponding position in the stack as the even code word is a zero.

7. In a digital system for communicating binary information over a communications channel synchronized by a system clock producing a plurality of system clock pulses having edges associated with the binary information, said binary information including a plurality of code words, wherein a change in the bit pattern between a bit and a prior adjacent bit represents a transition having a direction, a decryption device comprising:

serial to parallel converter means for receiving a plurality of stacks of code words over said channel and providing said code words in parallel form; and decoder means, coupled to said serial to parallel converter means, for receiving said code words in parallel form and for providing a plurality of corresponding data words in response to said code words, each code word comprising an m-bit binary number in which each bit either experiences a transition in the same direction as the system clock edge associated with that bit or experiences no transition from a prior adjacent bit, each stack comprising a plurality of code words communicated as a serial bit pattern over said channel at the same time as each other code word in the stack.

8. The decryption device of claim 7, wherein said stacks comprise a plurality of odd and even stacks alternating in time, each said odd stack comprising a plurality of odd code words, each said odd code word being communicated as a serial bit pattern over said channel at the same time as each other odd code word within said odd stack, each said odd code word comprising a code word in which the first of said system clock edges associated with said code word is in a first direction, each said even stack comprising a plurality of even code words, each said even code word being communicated as a serial bit pattern over said channel at the same time as each other even code word within said even stack, each said even code word comprising a code word in which the first of said system clock edges associated with said code word is in a second direction; and said decryption device further comprising:

decoder state control means, coupled to said serial to parallel converter means and said decoder means, for controlling said serial to parallel converter means and said decoder means.

9. The decryption device of claim 8, said serial to parallel converter means comprising:

a plurality of first odd shift register means, each first odd shift register means for serially loading a plurality of first alternating bits of an odd stack code word during a plurality of rising system clock pulse edges in a first decoder state, and for broadside unloading said first alternating bits of said odd stack code word in response to an odd full signal in a second decoder state, said first and second decoder states alternating in time;

a plurality of second odd shift register means, each second odd shift register means for serially loading a plurality of second alternating bits of an odd stack code word during a plurality of falling system clock pulse edges in the first decoder state, and for broadside unloading said second alternating bits of said odd stack code word in response to said odd full signal in the second decoder state, a plurality of first even shift register means, each first even shift register means for serially loading a plurality of first alternating bits of an even stack code word during a plurality of rising system clock pulse edges in the second decoder state, and for broadside unloading said first alternating bits of said even stack code word in response to an even full signal in the first decoder state;

a plurality of second even shift register means, each second even shift register means for serially loading a plurality of second alternating bits of an even stack code word during a plurality of falling system clock pulse edges in the second decoder state, and for broadside unloading said second alternating bits in response to said even full signal in the first decoder state, routing means for interleaving said first and second alternating bits of each odd stack code word to provide each odd stack code word in parallel form to said decoder means, and for interleaving said first and second alternating bits of each even stack code word to provide each even stack code word in parallel form to said decoder means;

said decoder state control means providing said odd full signal when said first and second odd shift registers are fully loaded, and providing said even full signal when said first and second even shift registers are fully loaded; and said decoder means comprising a plurality of decoder look up table means, each decoder look up table means for receiving a code word and providing a corresponding data word.

10. The decryption device of claim 9, each decoder look up table means further comprising means for using either a first or a second decoding table for decoding each code word into either a first or a second data word associated with said code word, in response to a first or a second decoder selection signal, respectively;

said first decoding table being comprised of data words in which the code words associated with said data words are those odd code words in which the first bit is a one, and those even code words in which the first bit is a one or a zero, said second decoding table being comprised of data words in which the code words associated with said data words are those odd code words in which the first bit is a one or a zero, and those even code words in which the first bit is a zero, said decryption device further comprising decoder selection logic means for:

testing the last bit of a previous code word received by each decoder look up table means, and providing said first decoder selection signal if the last bit of the previous code word is a one, and providing said second decoder selection signal if the last bit of the previous code word is a zero.

11. In a digital system for communicating binary information over a communications channel synchronized by a system clock producing a plurality of system clock pulses having edges associated with the binary information, said binary information including a plurality of code words, wherein a change in the bit pattern between a bit and a prior adjacent bit represents a transition having a direction, an encryption device comprising:

an encoder for providing a plurality of code words in response to a plurality of data words associated with said code words; and a parallel to serial converter responsive to said code words for providing a plurality of stacks over said channel, each said stack comprising a plurality of code words, each code word being transmitted in serial form at the same time as each other code word in the stack, each said code word comprising an m-bit binary number in which each bit either experiences a transition in the same direction as the system clock edge associated with that bit or experiences no transition from a prior adjacent bit.

12. The encryption device of claim 11, said encoder comprising:

a first encoder look-up table for providing an odd code word in response to an n-bit data word received during one of a plurality of input clock edges during one of a plurality of first states, and a second encoder look-up table for providing an even code word in response to an n-bit data word received during one of said input clock edges during one of a plurality of second states, said first and second states alternating in time, each said odd code word comprising a code word in which the first of said system clock edges associated with said code word is in a first direction, each said even code word comprising a code word in which the first of said system clock edges associated with said code word is in a second direction; and said parallel to serial converter comprising:

a plurality of first shift registers for receiving a plurality of said odd code words in parallel form from said first encoder look-up table during the first state and unloading said odd code words in serial form to produce one of a plurality of odd stacks; and a plurality of second shift registers for receiving a plurality of said even code words in parallel form from said second encoder look-up table during the second state and unloading said even code words in serial form to produce one of a plurality of even stacks; and said encryption device further comprising:

an encoder state machine, coupled to said first and second encoder look-up tables and said pluralities of first and second shift registers, for controlling said first and second encoder look-up tables and said pluralities of first and second shift registers in said first and second states.

13. The encryption device of claim 12, wherein each said first shift register successively broadside loads an odd code word during successive input clock edges in the first state and, after each said first shift register has been loaded, said plurality of first shift registers serially unloads said odd code words to provide said odd stack during the subsequent second state; and each second shift register successively broadside loads an even code word during successive input clock edges in the second state and, after each said second shift register has been loaded, said plurality of second shift registers serially unloads said even code words to provide said even stack during the subsequent first state.

14. The encryption device of claim 13, wherein for m even, each first shift register includes a first delimiter register for storing a "1" bit after each odd code word, and each second shift register includes a second delimiter register for storing a "0" bit after each even code word.

15. The encryption device of claim 13, further comprising a system clock shift register for, during the second state, providing an m-bit word of alternating ones and zeros beginning with a one bit, and, during the first state, providing an m-bit word of alternating ones and zeros beginning with a zero bit.

16. The encryption device of claim 12, said first encoder look up table further comprising a first and a second odd table of odd code words responsive to a first and a second odd selection signal;

said first odd table being comprised of odd code words in which the first bit is a one, said second odd table being comprised of odd code words in which the first bit either is a one or a zero;

said second encoder look up table further comprising a first and a second even table responsive to a first and a second even selection signal;

said first even table being comprised of even code words in which the first bit either is a one or a zero, said second even table being comprised of even code words in which the first bit is a zero;

said encryption device further comprising a selection logic circuit for:

testing the last bit of a previous even code word stored in each said second shift register, and providing said first odd selection signal if the last bit of the previous even code word occupying the corresponding position in the stack as the odd code word is a one, and providing said second odd selection signal if the last bit of the previous even code word occupying the corresponding position in the stack as the odd code word is a zero, testing the last bit of a previous odd code word stored in each said first shift register, and providing said first even selection signal if the last bit of the previous odd code word occupying the corresponding position in the stack as the even code word is a one, and providing said second even selection signal if the last bit of the previous odd code word occupying the corresponding position in the stack as the even code word is a zero.

17. In a digital system for communicating binary information over a communications channel synchronized by a system clock producing a plurality of system clock pulses having edges associated with the binary information, said binary information including a plurality of code words, wherein a change in the bit pattern between a bit and a prior adjacent bit represents a transition having a direction, a decryption device comprising:

a serial to parallel converter for receiving a plurality of stacks of code words over said channel and providing said code words in parallel form; and a decoder, coupled to said serial to parallel converter, for receiving said code words in parallel form and for providing a plurality of corresponding data words in response to said code words, each code word comprising an m-bit binary number in which each bit either experiences a transition in the same direction as the system clock edge associated with that bit or experiences no transition from a prior adjacent bit, each stack comprising a plurality of code words communicated as a serial bit pattern over said channel at the same time as each other code word in the stack.

18. The decryption device of claim 17, wherein said stacks comprise a plurality of odd and even stacks alternating in time, each said odd stack comprising a plurality of odd code words, each said odd code word being communicated as a serial bit pattern over said channel at the same time as each other odd code word within said odd stack, each said odd code word comprising a code word in which the first of said system clock edges associated with said code word is in a first direction, each said even stack comprising a plurality of even code words, each said even code word being communicated as a serial bit pattern over said channel at the same time as each other even code word within said even stack, each said even code word comprising a code word in which the first of said system clock edges associated with said code word is in a second direction; and said decryption device further comprising:

a decoder state machine, coupled to said serial to parallel converter and said decoder, for controlling said serial to parallel converter and said decoder.

19. The decryption device of claim 18, said serial to parallel converter comprising:

a plurality of first odd shift registers, each first odd shift register adapted to serially load a plurality of first alternating bits of an odd stack code word during a plurality of rising system clock pulse edges in a first decoder state, and to broadside unload said first alternating bits of said odd stack code word in response to an odd full signal in a second decoder state, said first and second decoder states alternating in time;

a plurality of second odd shift registers, each second odd shift register adapted to serially load a plurality of second alternating bits of an odd stack code word during a plurality of falling system clock pulse edges in the first decoder state, and to broadside unload said second alternating bits of said odd stack code word in response to said odd full signal in the second decoder state, a plurality of first even shift registers, each first even shift register means adapted to serially load a plurality of first alternating bits of an even stack code word during a plurality of rising system clock pulse edges in the second decoder state, and to broadside unload said first alternating bits of said even stack code word in response to an even full signal in the first decoder state;

a plurality of second even shift registers, each second even shift register adapted to serially load a plurality of second alternating bits of an even stack code word during a plurality of falling system clock pulse edges in the second decoder state, and to broadside unload said second alternating bits in response to said even full signal in the first decoder state, a routing circuit for interleaving said first and second alternating bits of each odd stack code word to provide each odd stack code word in parallel form to said decoder, and for interleaving said first and second alternating bits of each even stack code word to provide each even stack code word in parallel form to said decoder;

said decoder state machine providing said odd full signal when said first and second odd shift registers are fully loaded, and providing said even full signal when said first and second even shift registers are fully loaded; and said decoder comprising a plurality of decoder look up tables, each decoder look up table adapted to receive a code word and provide a corresponding data word.

20. The decryption device of claim 19, each decoder look up table further comprising a first and a second decoding table for decoding each code word into either a first or a second data word associated with said code word, in response to a first or a second decoder selection signal, respectively;

said first decoding table being comprised of data words in which the code words associated with said data words are those odd code words in which the first bit is a one, and those even code words in which the first bit is a one or a zero, said second decoding table being comprised of data words in which the code words associated with said data words are those odd code words in which the first bit is a one or a zero, and those even code words in which the first bit is a zero, said decryption device further comprising a decoder selection logic circuit for:

testing the last bit of a previous code word received by each decoder look up table, and providing said first decoder selection signal if the last bit of the previous code word is a one, and providing said second decoder selection signal if the last bit of the previous code word is a zero.

21. In a digital system for communicating binary information over a communications channel synchronized by a system clock producing a plurality of clock pulses having edges associated with the binary information, said binary information including code words, wherein a change in the bit pattern between a bit and a prior adjacent bit represents a transition having a direction, an apparatus for encoding data words of n bits each into a plurality of code words of m bits each, the apparatus comprising:

selection means for selecting from a plurality of m-bit binary numbers those binary numbers in which each bit either experiences a transition in the same direction as the system clock edge associated with that bit or experiences no transition from a prior adjacent bit; and assignment means for associating each data word with one of said selected binary numbers.

22. In a digital system for communicating binary information over a communications channel synchronized by a system clock producing a plurality of system clock pulses having edges associated with the binary information, said binary information including a plurality of code words, wherein a change in the bit pattern between a bit and a prior adjacent bit represents a transition having a direction, a method of encoding data words of n bits each into a plurality of code words of m bits each, comprising the step of:

selecting from a plurality of m-bit binary numbers those binary numbers in which each bit either experiences a transition in the same direction as the system clock edge associated with that bit or experiences no transition from a prior adjacent bit, wherein each of said selected binary numbers is a code word.

23. The method of claim 22, further comprising the step of:

associating each data word with one of said code words.

24. In a digital system for communicating binary information over a communications channel synchronized by a system clock producing a plurality of system clock pulses having edges associated with the binary information, said binary information including a plurality of code words, wherein a change in the bit pattern between a bit and a prior adjacent bit represents a transition having a direction, a method of communicating a plurality of code words, comprising the steps of:

forming a message comprising a plurality of data words, each data word associated with at least one code word, wherein each code word is an m-bit binary number in which each bit either experiences a transition in the same direction as the system clock edge associated with that bit or experiences no transition from a prior adjacent bit;

longitudinally serializing each code word associated with each data word of the message, so that each code word is represented by a serial bit pattern; and transmitting the associated serialized code words of the message in parallel with each other in a plurality of stacks.

25. The method of claim 24, wherein at least one of said stacks is an odd stack of code words comprising those code words selected from a set of odd code words wherein the first of said system clock edges associated with each of said odd code words is in a first direction.

26. The method of claim 25, wherein at least one of said stacks is an even stack of code words comprising those code words selected from a set of even code words wherein the first of said system clock edges associated with each of said even code words is in a second direction.

27. The method of claim 26, wherein the code words in a first stack are selected from the set of odd code words and the code words in the next consecutive stack are selected from the set of even code words, the code words in subsequent stacks being selected in the same alternating manner.

28. The method of claim 27, wherein each pair of consecutive stacks is separated by at least one clock pulse, said method further comprising the step of transmitting a delimiter word between each pair of code words in consecutive stacks, wherein the bits of each said delimiter word do not experience a transition in a direction opposite to that of the associated system clock edges occurring between the transmission of the stacks.

29. The method of claim 27, further comprising the steps of, for m odd:

in each odd stack, transmitting odd code words in which the first bit of an odd code word is a one if the last bit of a previous even code word occupying the corresponding position in the stack as the odd code word is a one, and transmitting odd code words in which the first bit of an odd code word is a one or a zero if the last bit of a previous even code word occupying the corresponding position in the stack as the odd code word is a zero; and in each even stack, transmitting even code words in which the first bit of an even code word is a one or a zero if the last bit of a previous odd code word occupying the corresponding position in the stack as the even code word is a one, and transmitting even code words in which the first bit of an even code word is a zero if the last bit of a previous odd code word occupying the corresponding position in the stack as the even code word is a zero.

30. The method of claim 24, wherein a plurality of code words are not associated with any of said data words, and at least one of said code words not associated with any of said data words is associated with a pad word, said method further comprising the step of transmitting at least one pad word in one of said stacks of said message.

31. The method of claim 24, wherein a plurality of code words are not associated with any of said data words, and one of said code words not associated with any of said data words is associated with an end of message word, said method further comprising the step of transmitting said end of message word as the last word in the last stack of said message.

32. The method of claim 24, further comprising the step of selecting only those code words that have either an odd or an even number of binary ones, wherein said code words also serve as longitudinal parity check codes.

33. The method of claim 24, wherein the number of bits per code word m is determined according to the equation:

$m =$ the smallest integer greater than $[(1.5 \times n) - 0.5]$.

34. The method of claim 24, further comprising the steps of:
receiving the plurality of stacks of associated code words of the message;
converting each serialized code word to parallel form;
addressing a look up table with each converted code word to recover the data word associated with each code word, wherein each data word is stored in said look up table at an address designated by the code word associated with each said data word.

35. In a digital system for communicating binary information over a communications channel synchronized by a system clock producing a plurality of system clock pulses having edges associated with the binary information, said binary information including code words, wherein a change in the bit pattern between a bit and a prior adjacent bit represents a transition having a direction, said code comprising:
a plurality of code words of m bits each representing a plurality of data words of n bits each, each said code word comprising an m-bit binary number in which each bit either experiences a transition in the same direction as the system clock edge associated with that bit or experiences no transition from a prior adjacent bit.

36. A digital system for communicating binary information over a communications channel synchronized by a system clock producing a plurality of system clock pulses having edges associated with the binary information, said binary information including a plurality of code words, wherein a change in the bit pattern between a bit and a prior adjacent bit represents a transition having a direction, the system comprising:
processing means for processing information;
memory means for storing information;
said communications channel comprising a bus means for communicating information;
said processor means and said memory means each having an interface means for coupling said processor means and said memory means to said bus means,
at least one of said interface means having an encryption device comprising:
encoder means for providing a plurality of code words in response to a plurality of data words associated with said code words; and
parallel to serial converter means for providing a plurality of stacks over said channel, each said stack comprising a plurality of code words, each code word being transmitted in serial form at the same time as each other code word in the stack,
each said code word comprising an m-bit binary number in which each bit either experiences a transition in the same direction as one of said system clock edges associated with that bit or experiences no transition from a prior adjacent bit; and
at least one of said interface means having a decryption device comprising:
serial to parallel converter means for receiving said stacks of code words over said channel and providing said code words in parallel form; and
decoder means, coupled to said serial to parallel converter means, for receiving said code words in parallel form and for providing a plurality of associated data words in response to said code words.

37. A digital system for communicating binary information over a communications channel synchronized by a system clock producing a plurality of system clock pulses having edges associated with the binary information, said binary information including a plurality of code words, wherein a change in the bit pattern between a bit and a prior adjacent bit represents a transition having a direction, the system comprising:
a plurality of processor means for processing information;
a plurality of message routing means coupled to each other for routing binary information over said channel;
a plurality of interface means for interfacing each said processor means to a message routing means,
at least one of said interface means having an encryption device comprising:
encoder means for providing a plurality of code words in response to a plurality of data words associated with said code words; and
parallel to serial converter means for providing a plurality of stacks over said channel, each said stack comprising a plurality of code words, each code word being transmitted in serial form at the same time as each other code word in the stack, each said code word comprising an m-bit binary number in which each bit either experiences a transition in the same direction as the system clock edge associated with that bit or experiences no transition from a prior adjacent bit; and at least one of said interface means having a decryption device comprising:
- serial to parallel converter means for receiving said stacks of code words over said channel and providing said code words in parallel form; and
- decoder means, coupled to said serial to parallel converter means, for receiving said code words in parallel form and for providing a plurality of associated data words in response to said code words.

38. A digital system for communicating binary information over a communications channel synchronized by a system clock producing a plurality of system clock pulses having edges associated with the binary information, said binary information including a plurality of code words, wherein a change in the bit pattern between a bit and a prior adjacent bit represents a transition having a direction, the system comprising:
- a processor for processing information;
- a memory for storing information;
- said communications channel comprising a bus for communicating information;
- said processor and said memory each having an interface for coupling said processor and said memory to said bus,
- at least one of said interfaces having an encryption device comprising:
  - an encoder for providing a plurality of code words in response to a plurality of data words associated with said code words; and
  - a parallel to serial converter for providing a plurality of stacks over said channel, each said stack comprising a plurality of code words, each code word being transmitted in serial form at the same time as each other code word in the stack,
  - each said code word comprising an m-bit binary number in which each bit either experiences a transition in the same direction as the system clock edge associated with that bit or experiences no transition from a prior adjacent bit; and
- at least one of said interfaces having a decryption device comprising:
  - a serial to parallel converter for receiving said stacks of code words over said channel and providing said code words in parallel form; and
  - a decoder, coupled to said serial to parallel converter, for receiving said code words in parallel form and for providing a plurality of associated data words in response to said code words.

39. A digital system for communicating binary information over a communications channel synchronized by a system clock producing a plurality of system clock pulses having edges associated with the binary information, said binary information including a plurality of code words, wherein a change in the bit pattern between a bit and a prior adjacent bit represents a transition having a direction, the system comprising:
- a plurality of processors for processing information;
- a plurality of message routers coupled to each other for routing binary information over said channel;
- a plurality of interfaces for interfacing each said processor to a message router,
- at least one of said interfaces having an encryption device comprising:
  - an encoder for providing a plurality of code words in response to a plurality of data words associated with said code words; and
  - a parallel to serial converter for providing a plurality of stacks over said channel, each said stack comprising a plurality of code words, each code word being transmitted in serial form at the same time as each other code word in the stack,
  - each said code word comprising an m-bit binary number in which each bit either experiences a transition in the same direction as the system clock edge associated with that bit or experiences no transition from a prior adjacent bit; and
- at least one of said interfaces having a decryption device comprising:
  - a serial to parallel converter for receiving said stacks of code words over said channel and providing said code words in parallel form; and
  - a decoder, coupled to said serial to parallel converter, for receiving said code words in parallel form and for providing a plurality of associated data words in response to said code words.

* * * * *